US 12,193,246 B2

(12) United States Patent
Lim et al.

(10) Patent No.: US 12,193,246 B2
(45) Date of Patent: Jan. 7, 2025

(54) IMAGE SENSORS AND ELECTRONIC DEVICES

(71) Applicant: Samsung Electronics Co., Ltd., Yongin-si (KR)

(72) Inventors: Seon-Jeong Lim, Yongin-si (KR); Gae Hwang Lee, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 510 days.

(21) Appl. No.: 17/530,010

(22) Filed: Nov. 18, 2021

(65) Prior Publication Data

US 2022/0173167 A1 Jun. 2, 2022

(30) Foreign Application Priority Data

Nov. 30, 2020 (KR) ........................ 10-2020-0164114

(51) Int. Cl.
*H10K 39/32* (2023.01)
*G02B 5/00* (2006.01)
*G02B 5/20* (2006.01)

(52) U.S. Cl.
CPC ............. *H10K 39/32* (2023.02); *G02B 5/003* (2013.01); *G02B 5/201* (2013.01)

(58) Field of Classification Search
CPC ..................................................... H01L 39/32
See application file for complete search history.

(56) References Cited

U.S. PATENT DOCUMENTS

| 8,035,708 B2 | 10/2011 | Takizawa et al. |
| 9,762,867 B2 | 9/2017 | Yamaguchi |

(Continued)

FOREIGN PATENT DOCUMENTS

| CN | 110650301 A | 1/2020 |
| JP | 2008258474 A | 10/2008 |

(Continued)

OTHER PUBLICATIONS

Extended European Search Report dated Apr. 28, 2022 for corresponding European Application No. 21207984.2.

(Continued)

*Primary Examiner* — Yu-Hsi D Sun
(74) *Attorney, Agent, or Firm* — Harness, Dickey & Pierce, P.L.C.

(57) ABSTRACT

An image sensor includes a color filter array, a first photoelectric conversion device configured to absorb first light passing through the color filter array and convert the absorbed first light into electrical signals, and a second photoelectric conversion device configured to absorb second light passing through both the color filter array and the first photoelectric conversion device and convert the absorbed second light into electrical signals. The first photoelectric conversion device includes a first photoelectric conversion layer configured to selectively absorb a mixed light of the first and second colors. The second photoelectric conversion device comprises a second photoelectric conversion layer configured to absorb light including a third color. Each of the first to third colors is one of three primary colors. The image sensor combines the electrical signals converted from the first and second photoelectric conversion devices to obtain electrical signals of the first to third colors.

17 Claims, 16 Drawing Sheets

(56) References Cited

U.S. PATENT DOCUMENTS

| | | | |
|---|---|---|---|
| 10,043,840 B2 | 8/2018 | Jin et al. | |
| 10,388,701 B2 | 8/2019 | Roh et al. | |
| 10,715,768 B2 | 7/2020 | Yamaguchi | |
| 10,879,302 B2 | 12/2020 | Lee et al. | |
| 10,950,641 B2 | 3/2021 | Jin et al. | |
| 2018/0331143 A1 | 11/2018 | Jin et al. | |
| 2018/0342627 A1* | 11/2018 | Hasegawa | H10K 85/6572 |
| 2019/0319062 A1 | 10/2019 | Lee et al. | |
| 2019/0349555 A1 | 11/2019 | Lee et al. | |
| 2020/0304761 A1 | 9/2020 | Yamaguchi | |
| 2021/0175452 A1* | 6/2021 | Takahashi | H01L 27/14667 |
| 2023/0144505 A1* | 5/2023 | Negoro | H01L 27/14645 257/40 |

FOREIGN PATENT DOCUMENTS

| | | |
|---|---|---|
| KR | 20170022177 A | 3/2017 |
| KR | 20170063075 A | 6/2017 |
| KR | 102134489 B1 | 7/2020 |

OTHER PUBLICATIONS

Mikio Ihama et al., 'CMOS Image Sensor with a Thin Overlaid Panchromatic Organic Photoconductive Layer for Sensors with Reduced Pixel Size' *IDW* 2009, pp. 2123-2126.

Hokuto Seo et al., 'Color Sensors with Three Vertically Stacked Organic Photodetectors' *Japanese Journal of Applied Physics*, vol. 46, No. 49, 2007, pp. L1240-L1242.

Satoshi Aihara et al., 'Stacked Image SensorWith Green- and Red-Sensitive Organic Photoconductive Films Applying Zinc Oxide Thin-Film Transistors to a Signal Readout Circuit' *IEEE Transactions on Electron Devices*, vol. 56, No. 11, Nov. 2009, pp. 2570-2576.

Seon-Jeong Lim et al., 'Organic-on-silicon complementary metal-oxide-semiconductor colour image sensors' *Scientific Reports*, 5:7708, Jan. 2015.

* cited by examiner

IMAGE SENSORS AND ELECTRONIC DEVICES

CROSS-REFERENCE TO RELATED APPLICATION

This application claims priority to and the benefit under 35 U.S.C. § 119 of Korean Patent Application No. 10-2020-0164114 filed in the Korean Intellectual Property Office on Nov. 30, 2020, the entire contents of which are incorporated herein by reference.

BACKGROUND

1. Field

Image sensors and electronic devices are disclosed.

2. Description of the Related Art

An imaging device such as a camera includes an image capturing element that captures an image and stores the captured image as electrical signals. The image capturing element may include an image sensor that disassembles incident light into separate components according to incident light wavelength and converts each component to an electrical signal.

SUMMARY

Some example embodiments provide an image sensor having a novel structure that is capable of reducing a thickness and increasing sensitivity and wavelength selectivity.

Some example embodiments provide an electronic device including the image sensor.

According to some example embodiments, an image sensor may include a color filter array, a first photoelectric conversion device configured to absorb first light that is a portion of light passing through the color filter array and convert the absorbed first light into first electrical signals, and a second photoelectric conversion device configured to absorb second light that is at least a portion of light passing through both the color filter array and the first photoelectric conversion device and convert the absorbed second light into second electrical signals. The first photoelectric conversion device may include a first electrode and a second electrode facing each other, and a first photoelectric conversion layer between the first electrode and the second electrode and configured to selectively absorb a first mixed light of a first color and a second color. The second photoelectric conversion device may include a third electrode and a fourth electrode facing each other and a second photoelectric conversion layer between the third electrode and the fourth electrode and configured to absorb light including a third color. Each color of the first color, the second color, and the third color may be one of three primary colors, and the first color, the second color, and the third color may be different from each other. The image sensor may be configured to combine the first electrical signals converted from the first photoelectric conversion device and the second electrical signals converted from the second photoelectric conversion device to obtain electrical signals of the first color, the second color, and the third color.

The image sensor may further include a substrate supporting the first photoelectric conversion device and the second photoelectric conversion device, and the substrate may not include any silicon-based photodiodes.

The first photoelectric conversion layer may be on an entire surface of the substrate.

The color filter array may include a first color filter and a second color filter that are each a different one of a cyan filter, a yellow filter, or a magenta filter, and the first color filter and the second color filter may be configured to selectively transmit second mixed light and third mixed light, respectively, wherein both the second mixed light and the third mixed light include the third color.

The first color filter and the second color filter may be alternately arranged along rows and columns.

The first photoelectric conversion layer may include a first light absorbing material configured to selectively absorb light of the first color and a second light absorbing material selectively configured to selectively absorb light of the second color, or the first photoelectric conversion layer may include a light absorbing material configured to selectively absorb mixed light of the first color and the second color.

The first light absorbing material configured to selectively absorb light of the first color and the second light absorbing material configured to selectively absorb light of the second color may be mixed or stacked in the first photoelectric conversion layer.

The second photoelectric conversion layer may include a light absorbing material configured to selectively absorb the light including the third color; a light absorbing material configured to selectively absorb a second mixed light of the third color and the first color; a light absorbing material configured to selectively absorb a third mixed light of the third color and the second color; a light absorbing material configured to selectively absorb a fourth mixed light of the first color, the second color, and the third color; or any combination thereof.

The image sensor may further include a third color filter between the first photoelectric conversion device and the second photoelectric conversion device, the third color filter being configured to selectively transmit the light including the third color.

The color filter array may include a cyan filter and a yellow filter, the first color may be blue, the second color may be red, and the third color may be green.

The image sensor may further include a green filter between the first photoelectric conversion device and the second photoelectric conversion device.

The color filter array may include a magenta filter and a cyan filter, and the first color may be red, the second color may be green, and the third color may be blue.

The image sensor may further include a blue filter between the first photoelectric conversion device and the second photoelectric conversion device.

The color filter array may include a yellow filter and a magenta filter, and the first color may be green, the second color may be blue, and the third color may be red.

The image sensor may further include a red filter between the first photoelectric conversion device and the second photoelectric conversion device.

The image sensor may further include a third photoelectric conversion device configured to absorb third light that is light of at least a portion of an infrared wavelength spectrum and to convert the absorbed third light into a third electrical signal.

According to some example embodiments, an image sensor may include a first photoelectric conversion device configured to convert a first mixed light of a first color and a second color to first electrical signals, a second photoelectric conversion device configured to convert light of a third color to second electrical signals, and a substrate supporting the first photoelectric conversion device and the second photoelectric conversion device. The first photoelectric conversion device and the second photoelectric conversion device may be stacked along a thickness direction of the substrate. The first photoelectric conversion device may include a first organic light absorbing material configured to selectively absorb light of the first color and the second color, and the second photoelectric conversion device may include a second organic light absorbing material configured to absorb light of the third color.

The first photoelectric conversion device may include a first section configured to convert light of the first color to an electrical signal, and a second section configured to convert light of the second color to a separate electrical signal The first section and the second section of the first photoelectric conversion device may commonly include a particular organic light absorbing material configured to selectively absorb light of the first color and a separate organic light absorbing material configured to selectively absorb light of the second color, or the first section and the second section of the first photoelectric conversion device may both include the first organic light absorbing material configured to selectively absorb the mixed light of the first color and the second color.

The second photoelectric conversion device may include an organic light absorbing material (e.g., a second organic light absorbing material) configured to selectively absorb the light of the third color; an organic light absorbing material configured to selectively absorb a second mixed light of the third color and the first color; an organic light absorbing material configured to selectively absorb a third mixed light of the third color and the second color; an organic light absorbing material configured to selectively absorb a fourth mixed light of the first color, the second color, and the third color; or any combination thereof.

The substrate may not include any silicon-based photodiodes.

The image sensor may further include a color filter array on the first photoelectric conversion device, wherein the color filter array includes a first color filter configured to selectively transmit a second mixed light of the first color and the third color, and a second color filter configured to selectively transmit a third mixed light of the second color and the third color.

The image sensor may further include a third color filter between the first photoelectric conversion device and the second photoelectric conversion device, the third color filter being configured to selectively transmit the light of the third color.

The image sensor may further include a third photoelectric conversion device configured to absorb separate light of at least a portion of an infrared wavelength spectrum and to convert the absorbed separate light into a separate electrical signal.

According to some example embodiments, an electronic device including the image sensor is provided.

A performance of the image sensor may be improved.

DETAILED DESCRIPTION

Figure 1:
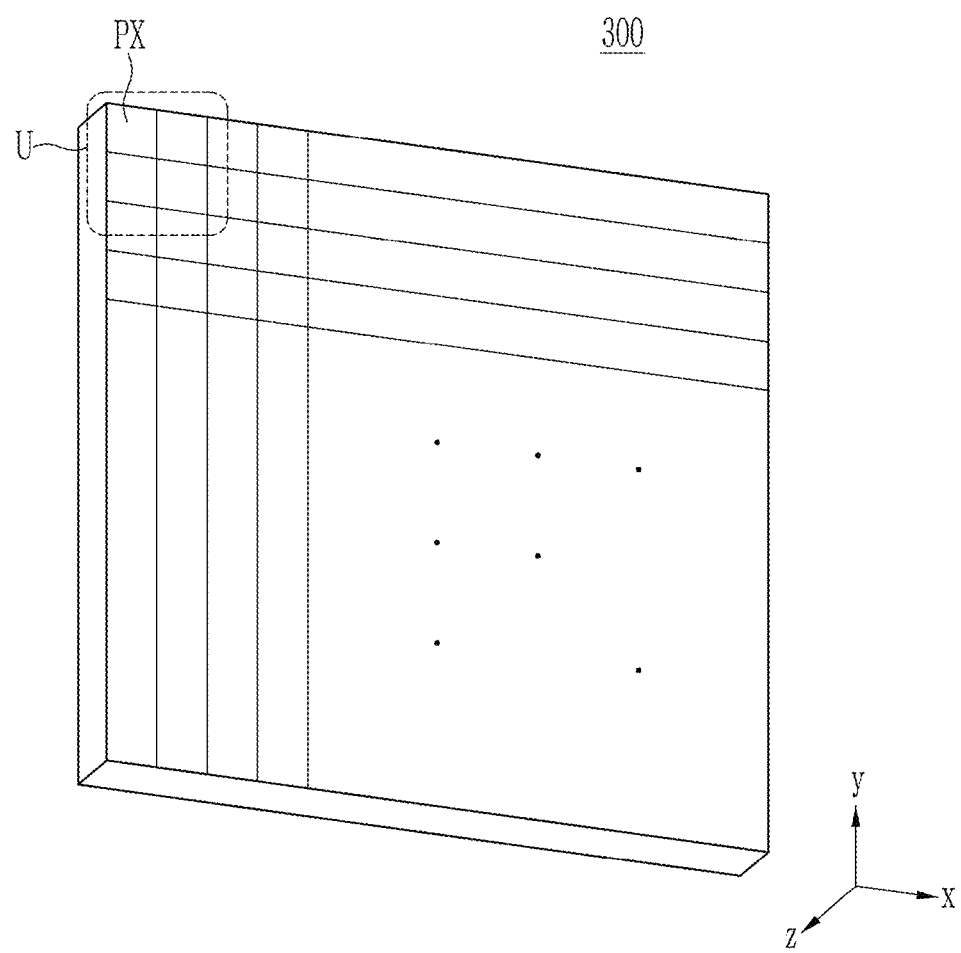
FIG. 1 is a plan view showing an example of a pixel arrangement of an image sensor according to some example embodiments.

Hereinafter, example embodiments are described in detail so that those skilled in the art can easily implement them. However, the actual applied structure may be implemented in various different forms and is not limited to some example embodiments described herein.

In the drawings, the thickness of layers, films, panels, regions, etc., are exaggerated for clarity. It will be understood that when an element such as a layer, film, region, or substrate is referred to as being "on" another element, it may be directly on the other element or intervening elements may also be present. In contrast, when an element is referred to as being "directly on" another element, there are no intervening elements present.

In the drawings, parts having no relationship with the description are omitted for clarity, and the same or similar constituent elements are indicated by the same reference numeral throughout the specification.

Hereinafter, the terms "lower portion" and "upper portion" are for convenience of description and do not limit the positional relationship.

As used herein, when a definition is not otherwise provided, "substituted" refers to replacement of hydrogen of a compound by a substituent selected from a halogen atom, a hydroxy group, an alkoxy group, a nitro group, a cyano group, an amino group, an azido group, an amidino group, a hydrazino group, a hydrazono group, a carbonyl group, a carbamyl group, a thiol group, an ester group, a carboxyl group or a salt thereof, a sulfonic acid group or a salt thereof, a phosphoric acid group or a salt thereof, a silyl group, a C1 to C20 alkyl group, a C2 to C20 alkenyl group, a C2 to C20 alkynyl group, a C6 to C30 aryl group, a C7 to C30 arylalkyl group, a C1 to C30 alkoxy group, a C1 to C30 thioalkoxy group, a C1 to C20 heteroalkyl group, a C3 to C20 heterocyclic group, a C3 to C20 heteroarylalkyl group, a C3 to C30 cycloalkyl group, a C3 to C15 cycloalkenyl group, a C6 to C15 cycloalkynyl group, a C3 to C30 heterocycloalkyl group, and any combination thereof.

Hereinafter, when a definition is not otherwise provided, "hetero" refers to inclusion of one or four heteroatoms selected from N, O, S, Se, Te, Si, and P.

Hereinafter, the upper surface of the image sensor is described as a light-receiving side, but this is for convenience of description and does not limit the positional relationship.

Hereinafter, "combination" refers to a mixture or a stacked structure of two or more.

It will be understood that when an element such as a layer, film, region, or substrate is referred to as being "on" another element, it may be directly on the other element or intervening elements may also be present. In contrast, when an element is referred to as being "directly on" another element, there are no intervening elements present. It will further be understood that when an element is referred to as being "on" another element, it may be above or beneath or adjacent (e.g., horizontally adjacent) to the other element.

It will be understood that elements and/or properties thereof (e.g., structures, surfaces, directions, or the like), which may be referred to as being "perpendicular," "parallel," "coplanar," or the like with regard to other elements and/or properties thereof (e.g., structures, surfaces, directions, or the like) may be "perpendicular," "parallel," "coplanar," or the like or may be "substantially perpendicular," "substantially parallel," "substantially coplanar," respectively, with regard to the other elements and/or properties thereof.

Elements and/or properties thereof (e.g., structures, surfaces, directions, or the like) that are "substantially perpendicular" with regard to other elements and/or properties thereof will be understood to be "perpendicular" with regard to the other elements and/or properties thereof within manufacturing tolerances and/or material tolerances and/or have a deviation in magnitude and/or angle from "perpendicular," or the like with regard to the other elements and/or properties thereof that is equal to or less than 10% (e.g., a. tolerance of ±10%).

Elements and/or properties thereof (e.g., structures, surfaces, directions, or the like) that are "substantially parallel" with regard to other elements and/or properties thereof will be understood to be "parallel" with regard to the other elements and/or properties thereof within manufacturing tolerances and/or material tolerances and/or have a deviation in magnitude and/or angle from "parallel," or the like with regard to the other elements and/or properties thereof that is equal to or less than 10% (e.g., a. tolerance of ±10%).

Elements and/or properties thereof (e.g., structures, surfaces, directions, or the like) that are "substantially coplanar" with regard to other elements and/or properties thereof will be understood to be "coplanar" with regard to the other elements and/or properties thereof within manufacturing tolerances and/or material tolerances and/or have a deviation in magnitude and/or angle from "coplanar," or the like with regard to the other elements and/or properties thereof that is equal to or less than 10% (e.g., a. tolerance of ±10%)).

It will be understood that elements and/or properties thereof may be recited herein as being "the same" or "equal" as other elements, and it will be further understood that elements and/or properties thereof recited herein as being "identical" to, "the same" as, or "equal" to other elements may be "identical" to, "the same" as, or "equal" to or "substantially identical" to, "substantially the same" as or "substantially equal" to the other elements and/or properties thereof. Elements and/or properties thereof that are "substantially identical" to, "substantially the same" as or "substantially equal" to other elements and/or properties thereof will be understood to include elements and/or properties thereof that are identical to, the same as, or equal to the other elements and/or properties thereof within manufacturing tolerances and/or material tolerances. Elements and/or properties thereof that are identical or substantially identical to and/or the same or substantially the same as other elements and/or properties thereof may be structurally the same or substantially the same, functionally the same or substantially the same, and/or compositionally the same or substantially the same.

It will be understood that elements and/or properties thereof described herein as being "substantially" the same and/or identical encompasses elements and/or properties thereof that have a relative difference in magnitude that is equal to or less than 10%. Further, regardless of whether elements and/or properties thereof are modified as "substantially," it will be understood that these elements and/or properties thereof should be construed as including a manufacturing or operational tolerance (e.g., ±10%) around the stated elements and/or properties thereof.

When the terms "about" or "substantially" are used in this specification in connection with a numerical value, it is intended that the associated numerical value include a tolerance of ±10% around the stated numerical value. When ranges are specified, the range includes all values therebetween such as increments of 0.1%.

Hereinafter, an example of an image sensor according to some example embodiments is described.

Figure 2:
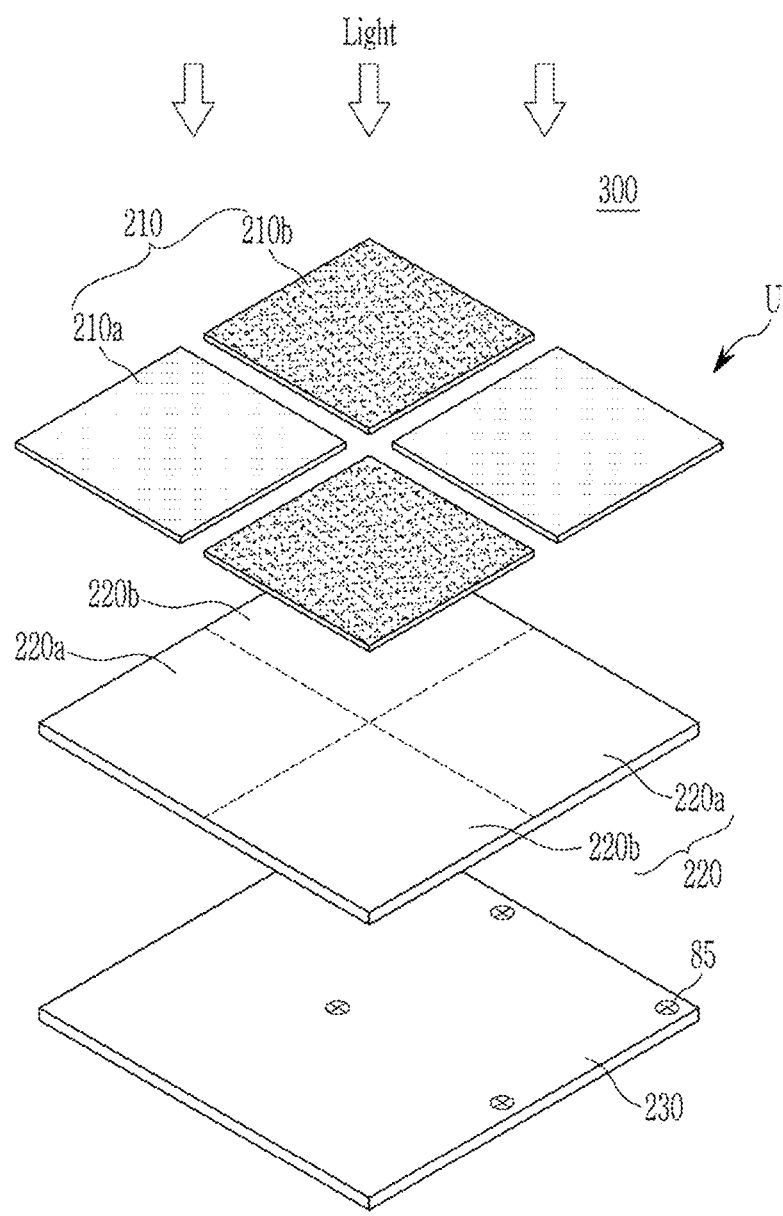
FIG. 2 is a plan view illustrating an example of a unit pixel group of the image sensor of FIG. 1.
Figure 3:
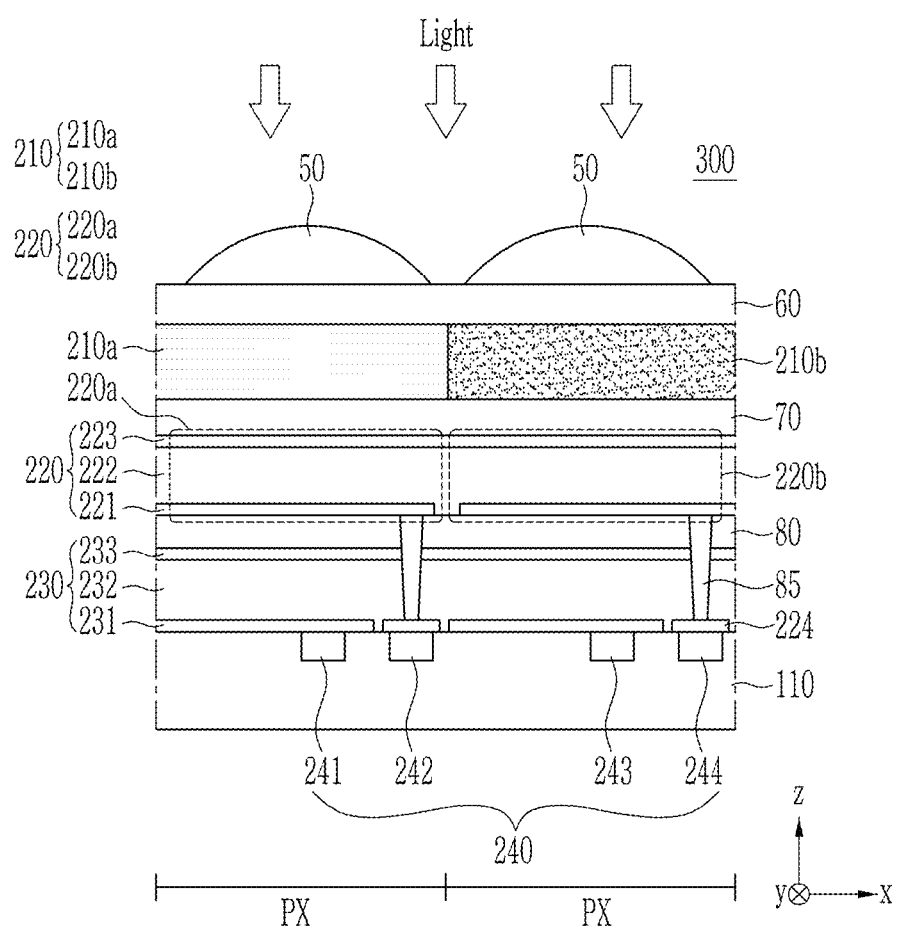
FIG. 3 is a schematic cross-sectional view showing an example of two adjacent pixels in the image sensor of FIGS. 1 and 2.

FIG. 1 is a plan view showing an example of a pixel arrangement of an image sensor according to some example embodiments, FIG. 2 is a plan view illustrating an example of a unit pixel group of the image sensor of FIG. 1, and FIG. 3 is a schematic cross-sectional view showing an example of two adjacent pixels in the image sensor of FIGS. 1 and 2.

The image sensor 300 according to some example embodiments includes a plurality of pixels for an image (hereinafter, referred to as "pixels") for photoelectric conversion of light of first color, second color, or third color in the visible wavelength spectrum, and a combination of the pixels may provide a particular (or, alternatively, predetermined) image.

Referring to FIG. 1, the image sensor 300 according to some example embodiments includes pixels PX arranged along rows and/or columns. Each pixel PX may be configured to selectively photoelectrically convert light of a first, second, or third color in a visible wavelength spectrum. Herein, each color of the first, second, and third colors may be one of three primary colors and may be different from each other. For example, one of the first, second, or third colors of light may be light of a blue wavelength spectrum having a maximum absorption wavelength (Amax) in a wavelength spectrum of greater than or equal to about 380 nm and less than about 500 nm (hereinafter referred to as "blue light"), another one of the first, second or third colors may be light in the green wavelength spectrum having a maximum absorption wavelength (Amax) in a wavelength spectrum of about 500 nm to about 600 nm (hereinafter referred to as "green light"), and another one of the first, second or third colors may be light in a red wavelength spectrum having a maximum absorption wavelength (Amax) in a wavelength spectrum of greater than about 600 nm and less than about 750 nm (hereinafter referred to as "red light"). The plurality of pixels PX forming a repeating pattern may form a unit pixel group U.

Referring to FIG. 2, the image sensor 300 according to some example embodiments includes a color filter array 210, a first photoelectric conversion device 220, and a second photoelectric conversion device 230 which are sequentially stacked from a light incident surface.

The color filter array 210 may include a plurality of first color filters 210a and a plurality of second color filters 210b, and the plurality of first color filters 210a and the plurality of second color filters 210b may be arranged alternately along a row and/or column. The color filter array 210 may be configured to selectively transmit light having a particular (or, alternatively, predetermined) wavelength spectrum among incident light.

The first photoelectric conversion device 220 may be configured to absorb a portion of light passed through the color filter array 210 (also referred to herein as first light that is a portion of light passing through the color filter array 210) and convert the absorbed light to electrical signals (also referred to herein as first electrical signals). The first photoelectric conversion device 220 may include a first section 220a overlapped with the first color filter 210a and a second section 220b overlapped with the second color filter 210b. The first photoelectric conversion device 220 may be configured to selectively absorb light in a portion of the visible wavelength spectrum and transmit light in the other wavelength spectrum. For example, the first photoelectric conversion device 220 may be configured to selectively absorb a mixed color (e.g., a mixed light of a mixed color) of any two of a first color, a second color, and a third color in a visible light wavelength spectrum and may be configured to transmit the other color. For example, the first photoelectric conversion device 220 may be configured to selectively absorb a first mixed light of a first color and a second color and may be configured to convert the first mixed light of the first color and the second color to electrical signals (e.g., first electrical signals). The first photoelectric conversion device 220 may include a light absorbing layer configured to selectively absorb the mixed color as described above, and the light absorbing layer may be on a whole surface (e.g., an entire surface) without additional patterning. The first photoelectric conversion layer 222 may be on an entire surface of the substrate 110 (e.g., may overlap an entire upper surface of the substrate 110 in the Z direction). The first photoelectric conversion device 220 may be, for example, an organic photoelectric conversion device including an organic light absorbing layer.

The second photoelectric conversion device 230 may be configured to absorb at least a portion of light passed through the color filter array 210 and the first photoelectric conversion device 220 (also referred to herein as second light that is a portion of light passing through both the color filter array 210 and the first photoelectric conversion device 220) and may be configured to convert the absorbed light to electrical signals (also referred to herein as second electrical signals). Such light may be light of a third color. The second photoelectric conversion device 230 may be configured to selectively absorb light in the visible wavelength spectrum among the light passed through the color filter array 210 and the first photoelectric conversion device 220, and may be configured to absorb, for example, light of one of the first color, the second color, or the third color passed through the first photoelectric conversion device 220. The second photoelectric conversion device 230 may include a light absorbing layer configured to selectively absorb light in the visible wavelength spectrum. For example, the second photoelectric conversion device 230 may be an organic photoelectric conversion device including an organic light absorbing layer.

The image sensor 300 may combine the electrical signals converted from the first photoelectric conversion device 220 (e.g., first electrical signals) and the electrical signals converted from the second photoelectric conversion device 230 (e.g., second electrical signals) to obtain electrical signals of a first color, a second color, and a third color in the visible wavelength spectrum.

In more detail with reference to FIG. 3, the image sensor 300 according to some example embodiments includes a focusing lens 50 on a light incident surface; a color filter array 210; a first photoelectric conversion device 220; and a second photoelectric conversion device 230. The color filter array 210, the first photoelectric conversion device 220, and the second photoelectric conversion device 230 are formed on the substrate 110 and are stacked along the thickness direction (e.g., z direction) of the substrate 110. Accordingly, it will be understood that the substrate 110 may support the first photoelectric conversion device 220 and the second photoelectric conversion device 230.

The focusing lens 50 may control the direction of incident light to focus light to each pixel PX. The focusing lens 50 may have, for example, a cylinder shape or a hemispherical shape, but is not limited thereto. The focusing lens 50 may be omitted in some cases.

The color filter array 210 includes a first color filter 210a and a second color filter 210b alternately arranged along a row and/or column (e.g., an array of first and second color filters 210a and 210b). Each of the first color filter 210a and the second color filter 210b may be configured to selectively transmit light of a mixture of any two of a first color, a second color, and a third color in the visible wavelength spectrum, and may be configured to block and/or absorb light of the other color of the first color, the second color, and the third color. The first color filter 210a may be configured to selectively transmit a second mixed light of the first color and the third color, and the second color filter 210b may be configured to selectively transmit a third mixed light of the second color and the third color. The first color filter 210a and the second color filter 210b may each independently be selected from a cyan filter configured to selectively transmit blue light and green light, a yellow filter configured to selectively transmit red light and green light, and a magenta filter configured to selectively transmit red light and blue light. The first color filter 210a and the second color filter 210b may each independently be one of a cyan filter configured to selectively transmit blue light and green light, a yellow filter configured to selectively transmit red light and green light, or a magenta filter configured to selectively transmit red light and blue light.

The first color filter 210a and the second color filter 210b may be configured to, for example, selectively transmit mixed light including a third color in common. Accordingly, the first color filter 210a and the second color filter 210b may be configured to selectively transmit second mixed light and third mixed light, respectively, wherein both the second mixed light and the third mixed light include the third color. For example, the first color filter 210a may be configured to selectively transmit the mixed light of the first color and the third color, and the second color filter 210*b* may be configured to selectively transmit the mixed light of the second color and the third color.

For example, when the first color is blue, the second color is red, and the third color is green, the first color filter 210*a* may be a cyan filter configured to selectively transmit blue light and green light, and the second color filter 210*b* may be a yellow filter configured to selectively transmit red light and green light.

For example, when the first color is green, the second color is blue, and the third color is red, the first color filter 210*a* may be a yellow filter configured to selectively transmit green light and red light, and the second color filter 210*b* may be a magenta filter configured to selectively transmit blue light and red light.

For example, when the first color is red, the second color is green, and the third color is blue, the first color filter 210*a* may be a magenta filter configured to selectively transmit red light and blue light, and the second color filter 210*b* may be a cyan filter configured to selectively transmit green light and blue light.

The substrate 110 may be a support substrate supporting the color filter array 210, the first photoelectric conversion device 220, and the second photoelectric conversion device 230, for example, a glass substrate, a metal substrate, a semiconductor substrate, or a polymer substrate. The substrate 110 may include a charge storage 240 and a circuit (not shown). The circuit may include, for example, a transfer transistor, a driving transistor, a selective transistor, a reset transistor, or any combination thereof, but is not limited thereto.

As described above, the image sensor 300 may combine the first photoelectric conversion device 220 and the second photoelectric conversion device 230 to obtain electrical signals of a first color, a second color, and a third color in the visible wavelength spectrum, and thus the substrate 110 may not include a separate photo-detecting device such as a silicon photodiode. The substrate 110 may not comprise any silicon-based photodiodes. Accordingly, the choice of substrates other than semiconductor substrates such as silicon wafers may be wide. The thickness of the substrate 110 may be reduced by the thickness of the photodiode. For example, considering that the thickness of a typical silicon photodiode is greater than or equal to about 3 μm, the thickness of the substrate 110 may be greatly reduced. In addition, since a space occupied by the photodiode in the substrate 110 is unnecessary, an arrangement and design of constituent elements in the substrate 110 may be free, and additional circuits for each pixel may be disposed.

A metal wire (not shown) and pad (not shown) may be formed on the lower or upper portion of the substrate 110. The metal wire and the pad may include a metal having a low specific resistance, such as aluminum (Al), copper (Cu), silver (Ag), and an alloy thereof in order to reduce signal delay.

The first photoelectric conversion device 220 may be between the substrate 110 and the color filter array 210, and may be configured to absorb light passed through the first color filter 210*a* and the second color filter 210*b* of the color filter array 210.

The first photoelectric conversion device 220 includes a first electrode 221 and a second electrode 223 facing each other, and a first photoelectric conversion layer 222 between the first electrode 221 and the second electrode 223.

One of the first electrode 221 or the second electrode 223 may be a light-receiving electrode at a light incidence side, and for example, the second electrode 223 may be a light-receiving electrode.

One of the first electrode 221 or the second electrode 223 may be an anode and the other may be a cathode. For example, the first electrode 221 may be an anode and the second electrode 223 may be a cathode. For example, the first electrode 221 may be a cathode and the second electrode 223 may be an anode. One of the first electrode 221 or the second electrode 223 may be a pixel electrode, and the other may be a common electrode. For example, the first electrode 221 may be a pixel electrode and the second electrode 223 may be a common electrode.

At least one of the first electrode 221 or the second electrode 223 may be a light-transmitting electrode. For example, each of the first electrode 221 and the second electrode 223 may be a light-transmitting electrode. The light-transmitting electrode may have a light transmittance of greater than or equal to about 80%, greater than or equal to about 85%, greater than or equal to about 90%, or greater than or equal to about 95%, and may include, for example, at least one of an oxide conductor, a carbon conductor, or a metal thin film. The oxide conductor may include, for example, one or more selected from indium tin oxide (ITO), indium zinc oxide (IZO), zinc tin oxide (ZTO), aluminum tin oxide (ATO), aluminum zinc oxide (AZO), or any combination thereof, the carbon conductor may be one or more selected from graphene and carbon nanostructures, and the metal thin film may be a thin film including aluminum (Al), magnesium (Mg), silver (Ag), gold (Au), an alloy thereof, or any combination thereof.

The first photoelectric conversion layer 222 may be configured to selectively absorb a portion of the wavelength spectrum of the first color, the second color, and the third color in the visible light wavelength spectrum. Herein, the selective absorption means that the absorption spectrum in the corresponding wavelength spectrum is significantly higher than the absorption spectrum in other wavelength spectra. Herein, the "significantly higher" may mean that, for example, about 70% to about 100%, about 75% to about 100%, about 80% to about 100%, about 85% to about 100%, about 90% to about 100%, or about 95% to about 100% of a total area of the absorption spectrum belongs to the corresponding wavelength region.

For example, the first photoelectric conversion layer 222 may be configured to selectively absorb a mixed light of two selected from light of a first color, a second color, and a third color, and transmit the other light.

For example, the first photoelectric conversion layer 222 may be configured to selectively absorb mixed light of a first color and a second color and transmit light of a third color. Herein, an area of the absorption spectrum occupied by the wavelength spectrum of the first color and the wavelength spectrum of the second color may be for example about 70% to about 100%, about 75% to about 100%, about 80% to about 100%, about 85% to about 100%, about 90% to about 100%, or about 95% to about 100% relative to a total area of the absorption spectrum of a visible wavelength region (e.g., about 380 nm to about 700 nm).

As an example, the first photoelectric conversion layer 222 may include at least one p-type semiconductor and at least one n-type semiconductor which form a pn junction, and may generate excitons by receiving light from outside and then separate the generated excitons into holes and electrons. At least one of the p-type semiconductor or the n-type semiconductor may be a light absorbing material, and for example the p-type semiconductor and the n-type semiconductor may be a light absorbing material, respectively. For example, at least one of the p-type semiconductor or the n-type semiconductor may be an organic light absorbing material. For example, at least one of the p-type semiconductor or the n-type semiconductor may be a wavelength-selective light absorbing material configured to selectively absorb light of a particular (or, alternatively, predetermined) wavelength spectrum. For example, at least one of the p-type semiconductor or the n-type semiconductor is a wavelength-selective organic light absorbing material. The p-type semiconductor and the n-type semiconductor may have a maximum absorption wavelength (λmax) in the same or different wavelength regions. Each of the p-type semiconductor and the n-type semiconductor may be one or two or more.

The wavelength-selective organic light absorbing material may be, for example, a blue wavelength-selective organic light absorbing material, a red wavelength-selective organic light absorbing material, or a green wavelength-selective organic light absorbing material.

The blue wavelength-selective organic light absorbing material may include a material known in the art as an organic compound configured to selectively absorb light in a blue wavelength spectrum and convert the absorbed light into electrical signals. For example, the blue wavelength-selective organic light absorbing material may include fullerene, thiophene, rubrene, tetracene, coumarin, a derivative thereof, or any combination thereof, but is not limited thereto. For example, the blue wavelength-selective organic light absorbing material may include bi-phenyl-tri-thiophene.

The red wavelength-selective organic light absorbing material may include, for example, a material known in the art as an organic compound configured to selectively absorb light in a red wavelength spectrum and convert the absorbed light into an electrical signal. For example, the red wavelength-selective organic light absorbing material may be a metal phthalocyanine such as copper phthalocyanine or a derivative thereof, but is not limited thereto.

The green wavelength-selective organic light absorbing material may include a material known in the art as an organic compound configured to selectively absorb light in a green wavelength spectrum and convert absorbed light into an electrical signal. For example, the green wavelength-selective organic light absorbing material may be a compound including an electron donating moiety and an electron accepting moiety, and may include, for example, a compound represented by Chemical Formula I.

EDM-LM-EAM                     [Chemical Formula I]

In Chemical Formula I,
EDM may be an electron donating moiety,
EAM may be an electron accepting moiety, and
LM may be a π-conjugated linking moiety that links the electron donating moiety with the electron accepting moiety.

For example, the green wavelength-selective organic light absorbing material may be, for example, represented by Chemical Formula I-1.

[Chemical Formula I-1]

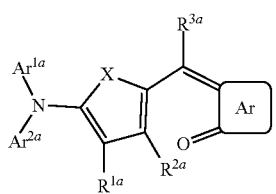

In Chemical Formula I-1,
X may be O, S, Se, Te, SO, $SO_2$, or $SiR^aR^b$,
Ar may be a substituted or unsubstituted C6 to C30 arylene group, a substituted or unsubstituted C3 to C30 heterocyclic group, or a fused ring of the foregoing two or more,
$Ar^{1a}$ and/or $Ar^{2a}$ may be a substituted or unsubstituted C6 to C30 aryl group or a substituted or unsubstituted C3 to C30 heteroaryl group,
$Ar^{1a}$ and $Ar^{2a}$ may independently be present or may be combined with each other to form a ring, and
$R^{1a}$ to $R^{3a}$, $R^a$, and $R^b$ may independently be hydrogen, deuterium, a substituted or unsubstituted C1 to C30 alkyl group, a substituted or unsubstituted C1 to C30 alkoxy group, a substituted or unsubstituted C6 to C30 aryl group, a substituted or unsubstituted C3 to C30 heteroaryl group, a halogen, a cyano group, or any combination thereof.

For example, $Ar^{1a}$ and $Ar^{2a}$ may independently be a substituted or unsubstituted phenyl group, a substituted or unsubstituted naphthyl group, a substituted or unsubstituted anthracenyl group, a substituted or unsubstituted phenanthrenyl group, a substituted or unsubstituted pyridinyl group, a substituted or unsubstituted pyridazinyl group, a substituted or unsubstituted pyrimidinyl group, a substituted or unsubstituted pyrazinyl group, a substituted or unsubstituted quinolinyl group, a substituted or unsubstituted isoquinolinyl group, a substituted or unsubstituted naphthyridinyl group, a substituted or unsubstituted cinnolinyl group, a substituted or unsubstituted quinazolinyl group, a substituted or unsubstituted phthalazinyl group, a substituted or unsubstituted benzotriazinyl group, a substituted or unsubstituted pyridopyrazinyl group, a substituted or unsubstituted pyridopyrimidinyl group, or a substituted or unsubstituted pyridopyridazinyl group.

$Ar^{1a}$ and $Ar^{2a}$ may be linked to each other to form a ring. For example, $Ar^{1a}$ and $Ar^{2a}$ may be linked to each other by one of a single bond, $-(CR^cR^d)_{n1}-$ (n1 is an integer of 1 or 2), $-O-$, $-S-$, $-Se-$, $-N=$, $-NRe-$, $-SiR^fR^g-$, or $-GeR^hR^i-$ to form a ring. Herein, $R^c$ to $R^i$ may independently be hydrogen, a substituted or unsubstituted C1 to C30 alkyl group, a substituted or unsubstituted C6 to C30 aryl group, a substituted or unsubstituted C3 to C30 heteroaryl group, a substituted or unsubstituted C1 to C6 alkoxy group, a halogen, a cyano group, or any combination thereof.

Specifically, the green wavelength-selective organic light absorbing material may include one or more of the compounds represented by one of Chemical Formulas I-2 to I-9.

[Chemical Formula I-2]

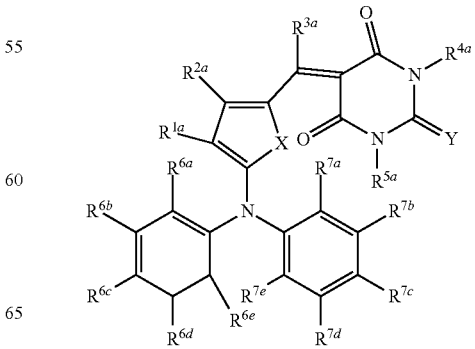

-continued

[Chemical Formula I-3]

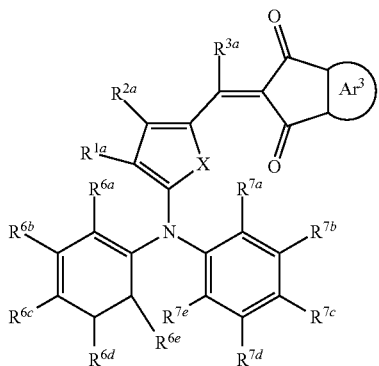

[Chemical Formula I-4]

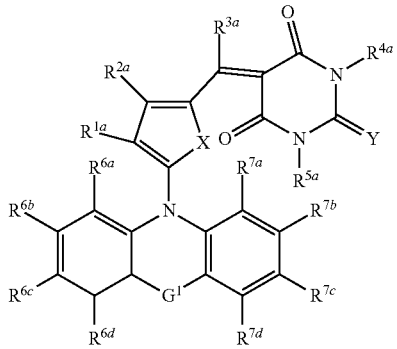

[Chemical Formula I-5]

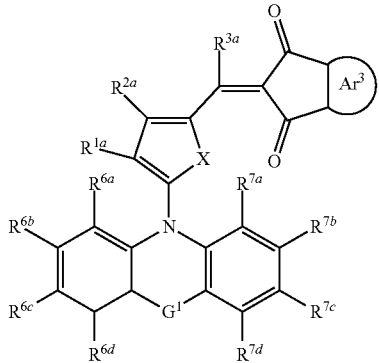

[Chemical Formula I-6]

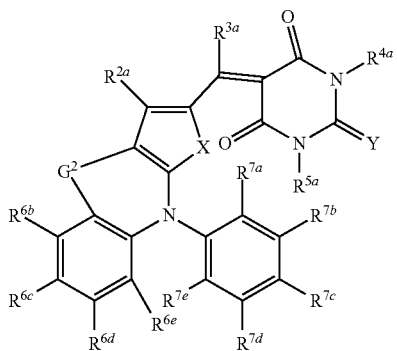

[Chemical Formula I-7]

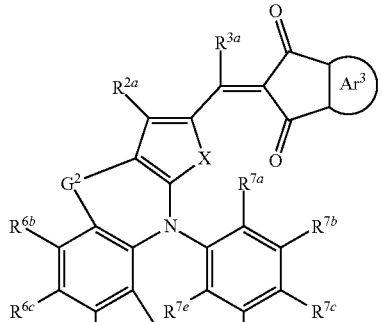

[Chemical Formula I-8]

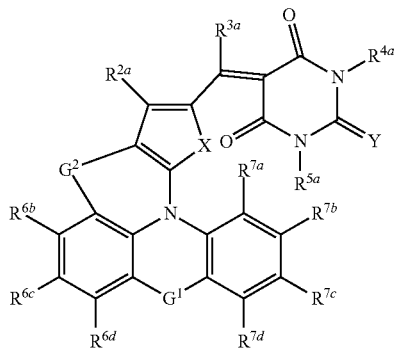

[Chemical Formula I-9]

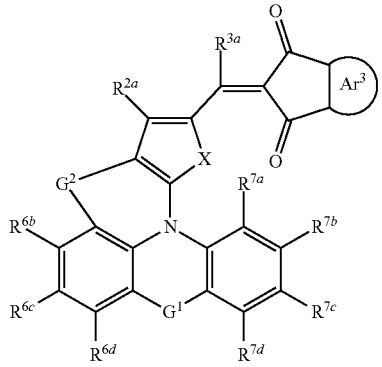

In Chemical Formulas I-2 to I-9,

X may be O, S, Se, Te, SO, SO$_2$, or SiR$^a$R$^b$,

Ar$^3$ may be a substituted or unsubstituted C6 to C30 arylene group, a substituted or unsubstituted C3 to C30 heterocyclic group, or a fused ring of the foregoing two or more, R$^{1a}$ to R$^{5a}$, R$^a$, and R$^b$ may independently be hydrogen, deuterium, a substituted or unsubstituted C1 to C30 alkyl group, a substituted or unsubstituted C1 to C30 alkoxy group, a substituted or unsubstituted C6 to C30 aryl group, a substituted or unsubstituted C3 to C30 heteroaryl group, a halogen, a cyano group, or any combination thereof, G$^1$ and/or G$^2$ may independently be a single bond, —(CR$^c$R$^d$)$_{n1}$— (n1 is an integer of 1 or 2), —O—, —S—, —Se—, —N=, —NRe—, —SiR$^f$R$^g$—, or —GeR$^h$R$^i$—, wherein R$^c$ to R$^i$ are independently hydrogen, a substituted or unsubstituted C1 to C30 alkyl group, a substituted or unsubstituted C6 to C30 aryl group, a substituted or unsubstituted C3 to C30 heteroaryl group, a substituted or unsubstituted C1 to C6 alkoxy group, a halogen, a cyano group, or any combination thereof, and $R^e$ and $R^d$, $R^f$ and $R^g$, and $R^h$ and $R^i$ may independently be present alone or linked to each other to form a ring, Y may be O, S, Se, Te, or C($R^j$)(CN), wherein $R^j$ is hydrogen, a cyano group (—CN), or a C1 to C10 alkyl group, $R^{6a}$ to $R^{6e}$ and $R^{7a}$ to $R^{7e}$ may independently be hydrogen, a substituted or unsubstituted C1 to C30 alkyl group, a substituted or unsubstituted C1 to C30 alkoxy group, a substituted or unsubstituted C6 to C30 aryl group, a substituted or unsubstituted C3 to C30 heteroaryl group, a halogen, a cyano group, or any combination thereof, and $R^{1a}$ to $R^{3a}$, $R^{6a}$ to $R^{6e}$, and $R^{7a}$ to $R^{7e}$ may independently be present or two adjacent groups may be linked to each other to form a ring.

For example, $Ar^3$ of Chemical Formulas I-3, I-5, I-7, and/or I-9 may be benzene, naphthylene, anthracene, thiophene, selenophene, tellurophene, pyridine, pyrimidine, or a fused ring of two or more selected therefrom.

For example, the first photoelectric conversion layer 222 may include a first light absorbing material configured to selectively absorb light of a first color and a second light absorbing material configured to selectively absorb light of a second color. The first light absorbing material and the second light absorbing material may be a p-type semiconductor or an n-type semiconductor, respectively. For example, one of the first light absorbing material or the second light absorbing material may be a p-type semiconductor and the other may be an n-type semiconductor. For example, each of the first light absorbing material and the second light absorbing material may be a p-type semiconductor, and may further include an n-type semiconductor. The n-type semiconductor may be, for example, a fullerene or a fullerene derivative. For example, each of the first light absorbing material and the second light absorbing material may be an n-type semiconductor, and may further include a p-type semiconductor. The first light absorbing material and the second light absorbing material may be entirely included along the in-plane direction (e.g., xy direction) of the first photoelectric conversion layer 222.

For example, the entire first photoelectric conversion layer 222 may include a mixture of a first light absorbing material and a second light absorbing material. For example, the entire first photoelectric conversion layer 222 may include one of a first light absorbing material or a second light absorbing material as a p-type semiconductor, and the other one of the first light absorbing material or the second light absorbing material as an n-type semiconductor. For example, the entire first photoelectric conversion layer 222 may include a first light absorbing material and a second light absorbing material as a p-type semiconductor and fullerene or a fullerene derivative as an n-type semiconductor.

For example, the first photoelectric conversion layer 222 may include a first layer including a first light absorbing material and a second layer including a second light absorbing material. The first layer and the second layer may be stacked along a thickness direction (e.g., z direction) of the first photoelectric conversion layer 222, and may be entirely stacked along an in-plane direction (e.g., xy direction) of the first photoelectric conversion layer 222. For example, the first layer of the first photoelectric conversion layer 222 may include a first light absorbing material as a p-type semiconductor and fullerene or a fullerene derivative as an n-type semiconductor, and the second layer of the first photoelectric conversion layer 222 may include a second light absorbing material as a p-type semiconductor and fullerene or a fullerene derivative as an n-type semiconductor.

For example, the first photoelectric conversion layer 222 may include a third light absorbing material configured to selectively absorb mixed light of a first color and a second color (e.g., the first mixed light). The third light absorbing material may be an organic light absorbing material configured to selectively absorb the mixed light of the first color and the second color. The third light absorbing material may be a material configured to selectively absorb mixed light of a first color and a second color, and the first photoelectric conversion layer 222 may include a third material as a p-type semiconductor, and may further include an n-type semiconductor. The n-type semiconductor may be, for example, a fullerene or a fullerene derivative.

For example, the first photoelectric conversion layer 222 may be configured to selectively absorb mixed light of blue light and red light.

For example, the first photoelectric conversion layer 222 may be configured to selectively absorb mixed light of red light and green light.

For example, the first photoelectric conversion layer 222 may be configured to selectively absorb mixed light of green light and blue light.

The first photoelectric conversion device 220 includes a first section 220a overlapped with the first color filter 210a of the color filter array 210 and a second section 220b overlapped with the second color filter 210b of the color filter array 210. The first section 220a and the second section 220b of the first photoelectric conversion device 220 are not structurally/materially different from each other, but may pass light of a different wavelength spectrum, and thus obtain electrical signals of different colors. The first section 220a may be configured to convert light of the first color to an electrical signal, and the second section 220b may be configured to convert light of the second color to a separate electrical signal, and the first section 220a and the second section 220b of the first photoelectric conversion device 220 may commonly comprise both a particular organic light absorbing material configured to selectively absorb the light of the first color and a separate organic light absorbing material configured to selectively absorb the light of the second color, or the first section 220a and the second section 220b of the first photoelectric conversion device 220 may comprise a same organic light absorbing material (e.g., a first organic light absorbing material) configured to selectively absorb a mixed light (e.g., first mixed light) of the first color and the second color.

For example, when the first color filter 210a is configured to selectively transmit mixed light of the first color and the third color and the first photoelectric conversion layer 222 is configured to selectively absorb mixed light of the first color and the second color, the first section 220a of the first photoelectric conversion device 220 may be configured to selectively absorb and photoelectrically convert light of the first color but transmit light of the third color to the second photoelectric conversion device 230.

For example, when the second color filter 210b is configured to selectively transmit mixed light of the second color and the third color and the first photoelectric conversion layer 222 is configured to selectively absorb mixed light of the first color and the second color, the second section 220b of the first photoelectric conversion device 220 may be configured to selectively absorb and photoelectrically convert light of the second color but transmit light of the third color to the second photoelectric conversion device 230.

Accordingly, the first section 220a of the first photoelectric conversion device 220 may obtain electrical signals from light of the first color, and the second section 220b of the first photoelectric conversion device 220 may obtain electrical signals from light of the second color. In other words, the first photoelectric conversion device 220 may obtain the electrical signals of the first and second colors. The first section 220a of the first photoelectric conversion device 220 may be configured to convert light of the first color to an electrical signal, and the second section 220b of the first photoelectric conversion device 220 may be configured to convert light of the second color to a separate electrical signal.

The first photoelectric conversion device 220 may further include an auxiliary layer (not shown) between the first electrode 221 and the first photoelectric conversion layer 222 and/or between the second electrode 223 and the first photoelectric conversion layer 222. The auxiliary layer may be, for example, a charge auxiliary layer or an optical auxiliary layer. The charge auxiliary layer may be, for example, a hole transport layer, a hole injection layer, a hole extraction layer, an electron blocking layer, an electron transport layer, an electron injection layer, an electron extraction layer, a hole blocking layer, or any combination thereof, and the optical auxiliary layer may be a light absorption auxiliary layer. The auxiliary layer may include an organic material, an inorganic material, an organic-inorganic material, or any combination thereof.

For example, one of the auxiliary layers may be an organic auxiliary layer.

For example, the organic auxiliary layer may include a compound represented by Chemical Formula M-1 or M-2.

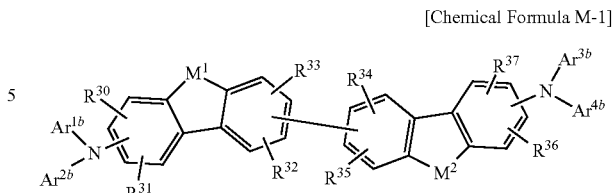

[Chemical Formula M-1]

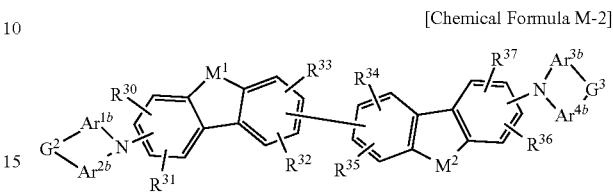

[Chemical Formula M-2]

In Chemical Formula M-1 or M-2, $M^1$ and $M^2$ may independently be $CR''R^o$, $SiR^pR^q$, $NR^r$, O, S, Se, or Te, $Ar^{1b}$, $Ar^{2b}$, $Ar^{3b}$, and $Ar^{4b}$ may independently be a substituted or unsubstituted C6 to C30 aryl group or a substituted or unsubstituted C3 to C30 heteroaryl group, $G^2$ and $G^3$ may independently be a single bond, —$(CR^sR^t)_{n3}$—, —O—, —S—, —Se—, —N=, —$NR^u$—, —$SiR^vR^w$—, or —$GeR^xR^y$—, wherein n3 may be 1 or 2, and $R^{30}$ to $R^{37}$ and $R''$ to $R^y$ may independently be hydrogen, a substituted or unsubstituted C1 to C30 alkyl group, a substituted or unsubstituted C6 to C30 aryl group, a substituted or unsubstituted C3 to C30 heterocyclic group, a substituted or unsubstituted C1 to C6 alkoxy group, a halogen, or a cyano group.

The compound represented by Chemical Formula M-1 or M-2 may be, for example, a compound represented by Chemical Formula M-3 or M-4.

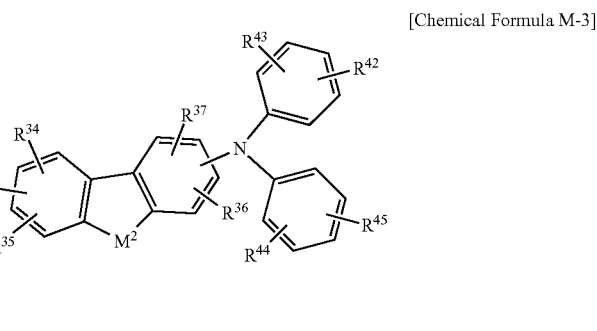

[Chemical Formula M-3]

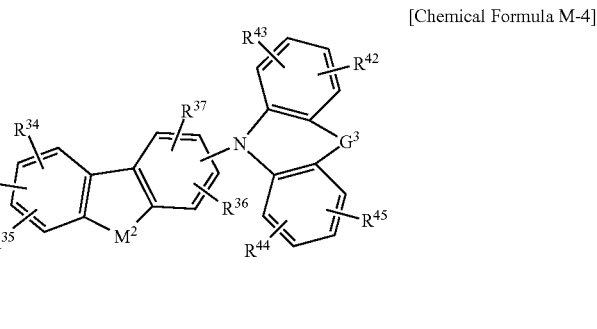

[Chemical Formula M-4]

In Chemical Formula M-3 or M-4, $M^1$, $M^2$, $G^2$, $G^3$, and $R^{30}$ to $R^{37}$ are the same as described above, and $R^{38}$ to $R^{45}$ may independently be hydrogen, a substituted or unsubstituted C1 to C30 alkyl group, a substituted or unsubstituted C6 to C30 aryl group, a substituted or unsubstituted C3 to C30 heteroaryl group, a substituted or unsubstituted C1 to C6 alkoxy group, a halogen, or a cyano group.

The compound represented by Chemical Formula M-3 or M-4 may be, for example, a compound represented by Chemical Formula M-5 or M-6.

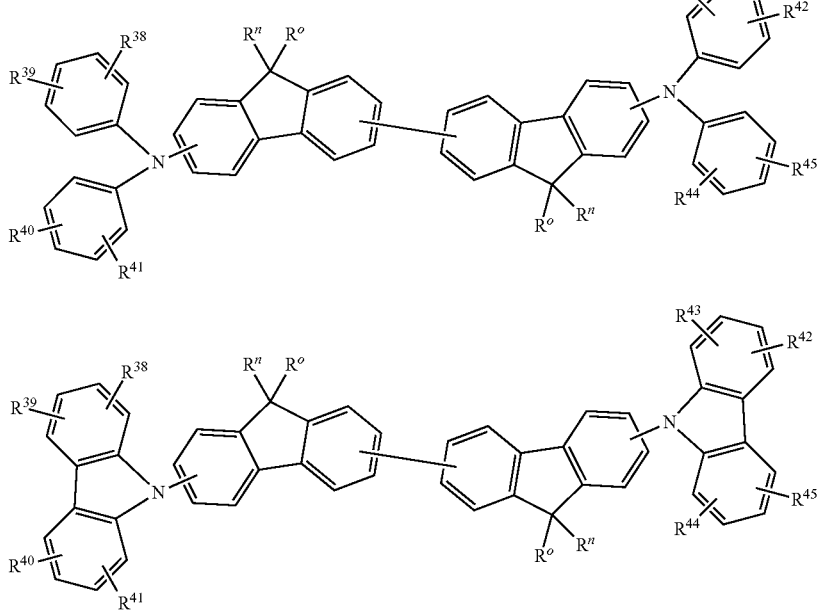

[Chemical Formula M-5]

[Chemical Formula M-6]

In Chemical Formula M-5 or M-6, $R^{38}$ to $R^{45}$ and $R^o$ and $R^n$ are the same as described above.

For example, the organic auxiliary layer may include a low molecular organic semiconductor, a polymer semiconductor, or any combination thereof having high charge mobility, and accordingly, charge mobility of the organic auxiliary layer may be higher than that of the first photoelectric conversion layer 222. For example, the organic auxiliary layer may include a low molecular weight organic semiconductor having an average molecular weight of less than or equal to about 3000. For example, the organic auxiliary layer may include an aromatic compound and/or a heteroaromatic compound, for example a fused polycyclic aromatic compound, a fused polycyclic heteroaromatic compound, or any combination thereof, for example a fused polycyclic aromatic compound such as pentacene and/or a fused polycyclic heteroaromatic compound including at least one of O, S, Se, Te, N, or any combination thereof, for example a fused polycyclic heteroaromatic compound including at least one of O, S, Se, Te, or any combination thereof. For example, the organic auxiliary layer may include a fused polycyclic aromatic compound and/or fused polycyclic heteroaromatic compound having a compact planar structure wherein four or more rings are fused with each other, for example a fused polycyclic aromatic compound and/or a fused polycyclic heteroaromatic compound wherein 5, 6, 7, 8, 9, 10, 11, or 12 rings are fused. For example, the organic auxiliary layer may be a fused polycyclic aromatic compound and/or a fused polycyclic heteroaromatic compound including at least one benzene ring. For example, the organic auxiliary layer may be a fused polycyclic heteroaromatic compound including at least one thiophene, selenophene, and/or tellurophene.

As an example, one of the auxiliary layers may be an inorganic auxiliary layer.

The inorganic auxiliary layer may include, for example, a lanthanide element, calcium (Ca), potassium (K), aluminum (Al), or an alloy thereof, and the lanthanide element may include, for example, ytterbium (Yb). A thickness of the inorganic auxiliary layer may be, for example, less than or equal to about 5 nm, and may have a thickness of about 1 nm to about 5 nm, about 1 nm to about 4 nm, about 1 nm to about 3 nm, or about 1 nm to about 2 nm within the above range.

For example, one of the auxiliary layers may be an organic-inorganic auxiliary layer.

As an example, one of the auxiliary layers may be an organic auxiliary layer and the other may be an inorganic auxiliary layer.

The first electrode 221 of the first photoelectric conversion device 220 may be electrically connected to charge storages 242 and 244 of the substrate 110 through a charge transfer path 85. An auxiliary electrode 224 may be optionally between the first electrode 221 and the charge storages 242 and 244.

For example, charges obtained by photoelectrically converting light of the first color may be collected in the charge storage 242 connected to the first electrode 221 in the first section 220a of the first photoelectric conversion device 220.

For example, charges obtained by photoelectrically converting light of the second color may be collected in the charge storage 244 connected to the first electrode 221 in the second section 220b.

A length of the charge transfer path 85 may be different depending on a thickness of the second photoelectric conversion device 230, for example, greater than or equal to about 150 nm and less than or equal to about 1500 nm. For example, the length of the charge transfer path 85 may be greater than or equal to about 170 nm, greater than or equal to about 200 nm, greater than or equal to about 220 nm, or greater than or equal to about 250 nm and less than or equal to about 1400 nm, less than or equal to about 1300 nm, less than or equal to about 1200 nm, less than or equal to about 1100 nm, less than or equal to about 1000 nm, less than or equal to about 900 nm, or less than or equal to about 800 nm. In addition, a maximum aspect ratio of the charge transfer path 85 may be greater than or equal to about 1.0 less than or equal to about 15.0. For example, the maximum aspect ratio of the charge transfer path 85 may be greater than or equal to about 1.5, greater than or equal to about 2.0, greater than or equal to about 2.5, or greater than or equal to about 3.0 and less than or equal to about 14.0, less than or equal to about 13.0, less than or equal to about 12.0, less than or equal to about 11.0, less than or equal to about 10.0, less than or equal to about 9.0, or less than or equal to about 8.0. The maximum aspect ratio of the charge transfer path 85 may be greater than or equal to about 2.0 and less than or equal to about 10.0. For example, the maximum aspect ratio of the charge transfer path 85 may be greater than or equal to about 2.5 or greater than or equal to about 3.0 and less than or equal to about 9.0 or less than or equal to about 8.0. Herein, the maximum aspect ratio of the charge transfer path 85 may be a ratio of a maximum length to a minimum width, and an average aspect ratio of the charge transfer path 85 may be a ratio of an average length to an average width. As described above, the image sensor 300 according to some example embodiments includes no separate silicon photodiode, and accordingly, the length and the aspect ratio and of the charge transfer path thereof may be much smaller than those of an image sensor including the silicon photodiode.

The second photoelectric conversion device 230 includes a third electrode 231 and a fourth electrode 233 facing each other, and a second photoelectric conversion layer 232 between the third electrode 231 and the fourth electrode 233.

One of the third electrode 231 or the fourth electrode 233 may be an anode and the other may be a cathode. For example, the third electrode 231 may be an anode and the fourth electrode 233 may be a cathode. For example, the third electrode 231 may be a cathode and the fourth electrode 233 may be an anode. One of the third electrode 231 or the fourth electrode 233 may be a pixel electrode and the other may be a common electrode. For example, the third electrode 231 may be a pixel electrode and the fourth electrode 233 may be a common electrode. At least one of the third electrode 231 or the fourth electrode 233 may be a light-transmitting electrode. For example, the third electrode 231 may be a reflective electrode and the fourth electrode 233 may be a light-transmitting electrode. For example, each of the third electrode 231 and the fourth electrode 233 may be a light-transmitting electrode.

The light-transmitting electrode is the same as described above. The reflective electrode may include a reflective conductor such as aluminum (Al), silver (Ag), gold (Au), or an alloy thereof.

The second photoelectric conversion layer 232 may be configured to absorb at least a portion of light passed through the first photoelectric conversion device 220, and such light may be light including a third color in contrast to a first mixed light of a first color and a second color that may be selectively absorbed by the first photoelectric conversion layer 222. As an example, when the first photoelectric conversion layer 222 is configured to selectively absorb the mixed light (e.g., first mixed light) of the first color and the second color and transmit the light of the third color, the second photoelectric conversion layer 232 may be configured to absorb the light of the third color. Accordingly, the second photoelectric conversion device 230 may obtain electrical signals of a third color from light of the third color.

The second photoelectric conversion layer 232 may include at least one p-type semiconductor and at least one n-type semiconductor which form a pn junction, and may generate excitons by absorbing at least a portion of light passed the first photoelectric conversion device 220 and then separate the generated excitons into holes and electrons. At least one of the p-type semiconductor or the n-type semiconductor may be a light absorbing material, and for example the p-type semiconductor and the n-type semiconductor may be a light absorbing material, respectively. For example, at least one of the p-type semiconductor or the n-type semiconductor may be an organic light absorbing material. For example, at least one of the p-type semiconductor or the n-type semiconductor may be a wavelength-selective light absorbing material configured to selectively absorb light of a particular (or, alternatively, predetermined) wavelength spectrum. For example, at least one of the p-type semiconductor or the n-type semiconductor is a wavelength-selective organic light absorbing material. The p-type semiconductor and the n-type semiconductor may have a maximum absorption wavelength (Amax) in the same or different wavelength spectra. Each of the p-type semiconductor and the n-type semiconductor may be one or two or more.

The second photoelectric conversion layer 232 may include a light absorbing material (e.g., an organic light absorbing material) configured to absorb light including the third color, for example, a light absorbing material configured to selectively absorb light of the third color; a light absorbing material configured to selectively absorb mixed light of the third color and the first color (e.g., a second mixed light); a light absorbing material configured to selectively absorb mixed light of the third color and the second color (e.g., a third mixed light); a light absorbing material configured to absorb mixed light of the first color, the second color, and the third color (e.g., a fourth mixed light); or any combination thereof. Herein, the light absorbing material may be, for example, an organic light absorbing material.

As an example, the second photoelectric conversion layer 232 may include a light absorbing material configured to absorb light including a third color as a p-type semiconductor and may further include an n-type semiconductor. The n-type semiconductor may be, for example, a fullerene or a fullerene derivative.

As an example, the second photoelectric conversion layer 232 may include a light absorbing material configured to absorb light including a third color as an n-type semiconductor and may further include a p-type semiconductor.

For example, when the first color filter 210a is a cyan filter configured to selectively transmit blue light and green light, the second color filter 210b is a yellow filter configured to selectively transmit green light and red light, and the first photoelectric conversion layer 222 is configured to selectively absorb the blue light and the red light, the second photoelectric conversion layer 232 may be configured to absorb light including a green color. For example, the second photoelectric conversion layer 232 may include a light absorbing material configured to selectively absorb green light; a light absorbing material configured to selectively absorb green light and blue light; a light absorbing material configured to selectively absorb green light and red light; a light absorbing material configured to selectively absorb green light, blue light, and red light; or any combination thereof.

For example, when the first color filter 210a is a magenta filter configured to selectively transmit blue light and red light, the second color filter 210b is a cyan filter configured to selectively transmit green light and blue light, and the first photoelectric conversion layer 222 is configured to selectively absorb the red light and the green light, the second photoelectric conversion layer 232 may be configured to absorb light including blue. For example, the second photoelectric conversion layer 232 may include a light absorbing material configured to selectively absorb blue light; a light absorbing material configured to selectively absorb blue light and green light; a light absorbing material configured to selectively absorb blue light and red light; a light absorbing material configured to selectively absorb blue light, green light, and red light; or any combination thereof.

For example, when the first color filter 210a is a yellow filter configured to selectively transmit red light and green light, the second color filter 210b is a magenta filter configured to selectively transmit blue light and red light, and the first photoelectric conversion layer 222 is configured to selectively absorb the green light and the blue light, the second photoelectric conversion layer 232 may be configured to absorb light including red. For example, the second photoelectric conversion layer 232 may include a light absorbing material configured to selectively absorb red light; a light absorbing material configured to selectively absorb red light and green light; a light absorbing material configured to selectively absorb red light and blue light; a light absorbing material configured to selectively absorb red light, green light, and blue light; or any combination thereof.

The light absorbing material may be, for example, an organic light absorbing material and may be, for example, a wavelength-selective organic light absorbing material. Examples of the blue wavelength-selective organic light absorbing material, the red wavelength-selective organic light absorbing material, or the green wavelength-selective organic light absorbing material are the same as described above.

The third electrode 231 of the second photoelectric conversion device 230 is electrically connected to the charge storages 241 and 243 of the substrate 110. In the drawing, separate charge transfer paths connecting the third electrode 231 to the charge storages 241 and 243 are not shown, but the third electrode 231 and the charge storages 241 and 243 may be connected each other through the charge transfer paths.

The second photoelectric conversion device 230 may be configured to, for example, photoelectrically convert light of the third color, and charges photoelectrically converted from the light of the third color may be collected in the charge storages 241 and 243.

The second photoelectric conversion device 230 may further include an auxiliary layer (not shown) between the third electrode 231 and the second photoelectric conversion layer 232 and/or the fourth electrode 233 and the second photoelectric conversion layer 232. The auxiliary layer may be, for example, a charge auxiliary layer or an optical auxiliary layer, as described above.

Between the color filter array 210 and the first photoelectric conversion device 220 and between the first photoelectric conversion device 220 and the second photoelectric conversion device 230, each interlayer insulating layer 70 and 80 is formed. The interlayer insulating layers 70 and 80 may be independently formed of an inorganic insulating material such as silicon oxide and/or silicon nitride or a low dielectric constant (low K) material such as SiC, SiCOH, SiCO, and SiOF. The interlayer insulating layer 80 may have the charge transfer path 85 exposing the auxiliary electrode 224. The charge transfer path 85 may be filled with a filler. At least one of the interlayer insulating layers 70 or 80 may be omitted.

An encapsulant 60 is formed between the color filter array 210 and the focusing lens 50. The encapsulant 60 may be an encapsulation plate or an encapsulation layer, and the encapsulation plate or encapsulation layer may include a glass substrate, a polymer substrate, a metal thin film and/or an insulating thin film, but is not limited thereto.

In this way, the image sensor 300 according to some example embodiments may obtain electrical signals of two colors among the first, second, and third colors from the first photoelectric conversion device 220, and electrical signals of the other one among the first, second, and third colors from the second photoelectric conversion device 230. For example, electrical signals of the first color and the second color may be obtained from the first photoelectric conversion device 220, and electrical signals of the third color may be obtained from the second photoelectric conversion device 230. Accordingly, since electrical signals of primary colors in the visible wavelength spectrum may be obtained without a separate photodiode in the substrate 110, a thickness of the image sensor 300 may be reduced as much as that of the photodiode, and simultaneously, since a space does not need for the photodiode in the substrate 110, constituent elements in the substrate 110 may be freely disposed and designed, and a circuit per pixel may be additionally disposed. In addition, sensitivity and wavelength selectivity may be much improved by photoelectrically converting light absorbed by the wavelength selective light absorbing material instead of a silicon photodiode having weak wavelength selectivity. In addition, since a patterning process of the first photoelectric conversion device 220 may be omitted, the process may be simplified.

Hereinafter, another example of an image sensor according to some example embodiments is described.

Figure 4:
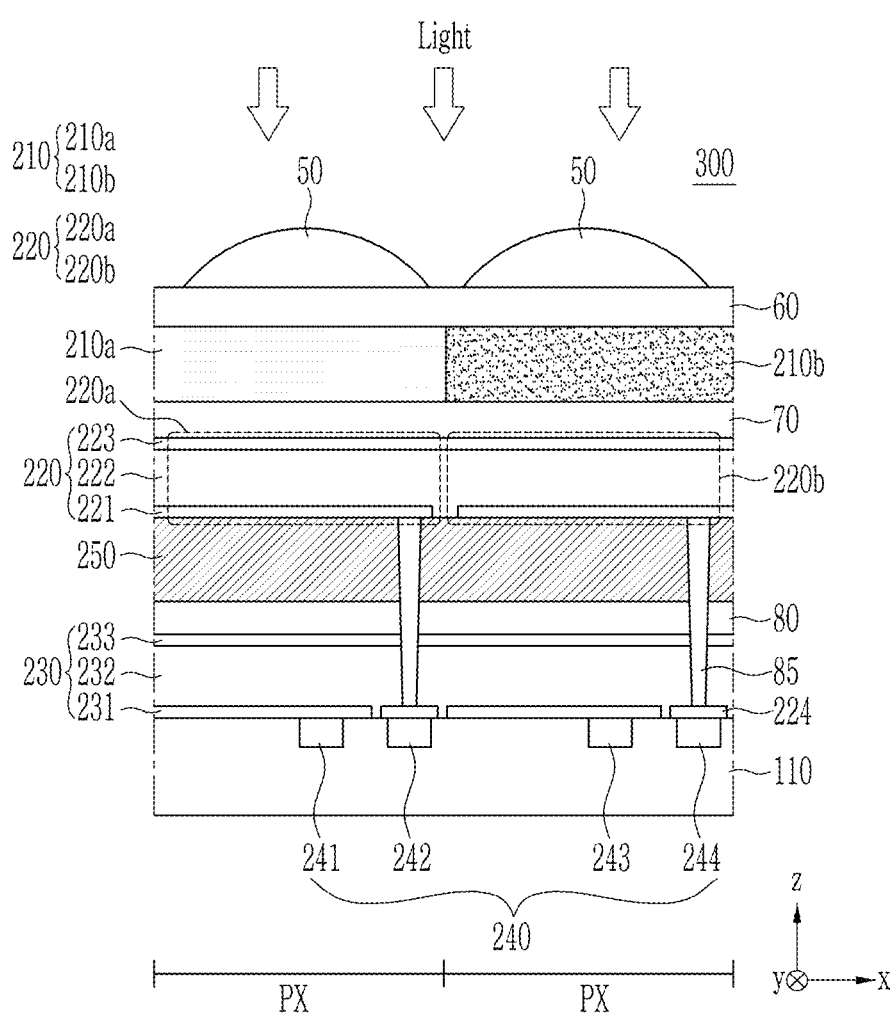
FIG. 4 is a schematic cross-sectional view showing another example of two adjacent pixels in the image sensor of FIGS. 1 and 2.

FIG. 4 is a schematic cross-sectional view showing another example of two adjacent pixels in the image sensor of FIGS. 1 and 2.

Referring to FIGS. 1 and 2 along with FIG. 4, the image sensor 300 according to some example embodiments, like some example embodiments including the example embodiments shown in FIG. 3, includes the focusing lens 50 on the light incident surface; the color filter array 210 under the focusing lens 50; and the first photoelectric conversion device 220 and the second photoelectric conversion device 230 under the color filter array 210.

However, the image sensor 300 according to some example embodiments, unlike some example embodiments including the example embodiments shown in FIG. 3, further includes a third color filter 250 between the first photoelectric conversion device 220 and the second photoelectric conversion device 230. The third color filter 250 may be configured to selectively transmit light of one among the first, second, and third colors in the visible wavelength spectrum, for example, light of a color flowing into the second photoelectric conversion device 230, for example, light of the third color. The third color filter 250 may be, for example, a red filter, a green filter, or a blue filter. The third color filter 250 may be configured to selectively transmit light of the third color that the second photoelectric conversion layer 232 is configured to selectively absorb.

The third color filter 250 may be formed on the whole surface of the substrate 110, for example, excluding a region where the charge transfer path 85 is disposed.

The third color filter 250 may increase color purity of light flowing into the second photoelectric conversion device 230. Accordingly, color separation characteristics may be improved without mixing of colors sensed by the second photoelectric conversion device 230, and cross-talks of the image sensor 300 may be reduced.

For example, when the first color filter 210a is a cyan filter configured to selectively transmit blue light and green light, the second color filter 210b is a yellow filter configured to selectively transmit green light and red light, and the first photoelectric conversion layer 222 is configured to selectively absorb the blue light and the red light, the third color filter 250 may be a green filter, and the second photoelectric conversion layer 232 may be configured to photoelectrically convert the green light to obtain electrical signals. Accordingly, the "first color" may be blue, the "second color" may be red, and the "third color" may be green.

For example, when the first color filter 210a is a magenta filter configured to selectively transmit blue light and red light, the second color filter 210b is a cyan filter configured to selectively transmit green light and blue light, and the first photoelectric conversion layer 222 is configured to selectively absorb the red light and the green light, the third color filter 250 may be a blue filter, and the second photoelectric conversion layer 232 may be configured to photoelectrically convert the blue light to obtain electrical signals. Accordingly, the "first color" may be red, the "second color" may be green, and the "third color" may be blue.

For example, when the first color filter 210a is a yellow filter configured to selectively transmit red light and green light, the second color filter 210b is a magenta filter configured to selectively transmit blue light and red light, and the first photoelectric conversion layer 222 is configured to selectively absorb the green light and the blue light, the third color filter 250 may be a red filter, and the second photoelectric conversion layer 232 may be configured to photoelectrically convert the red light to obtain electrical signals. Accordingly, the "first color" may be green, the "second color" may be blue, and the "third color" may be red.

Hereinafter, another example of an image sensor according to some example embodiments is described below.

Figure 5:
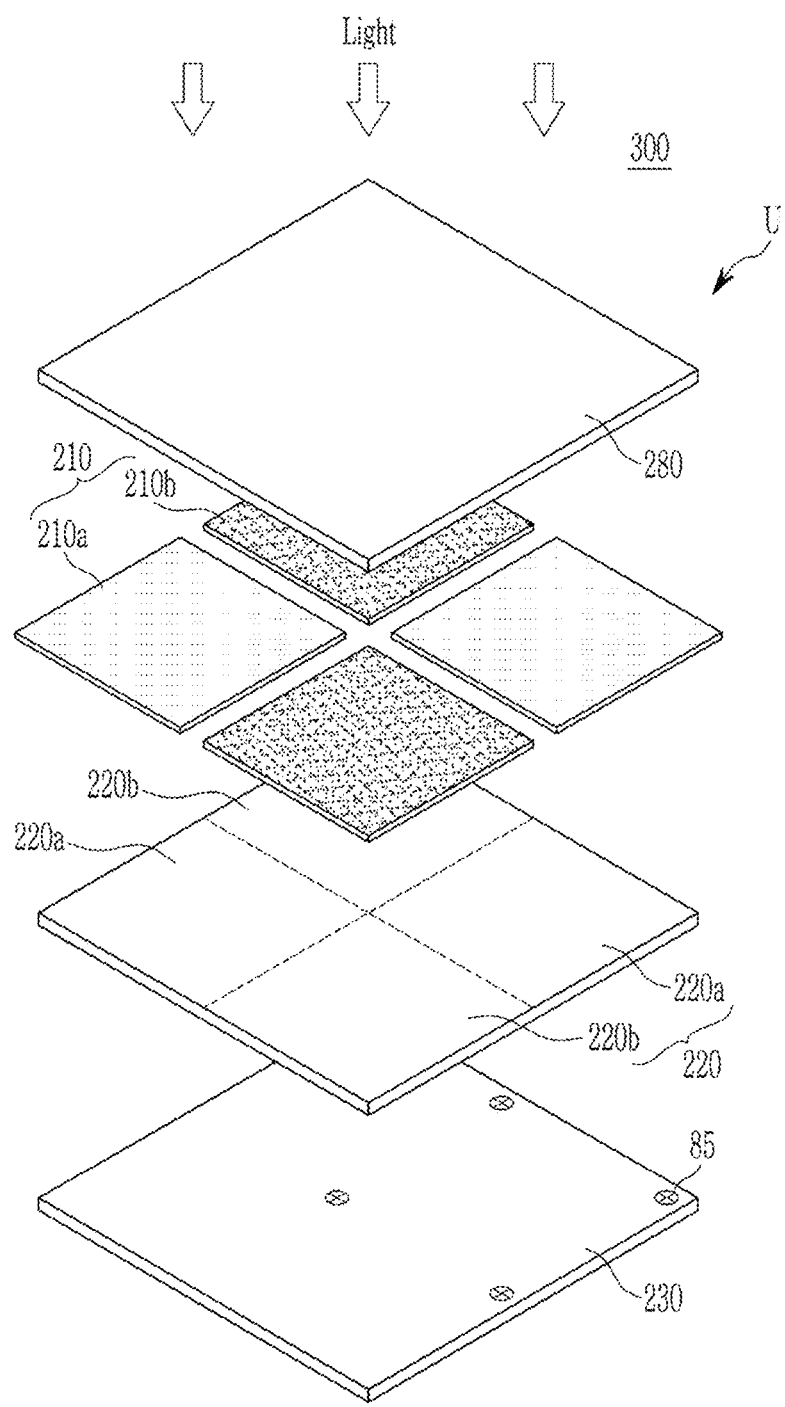
FIG. 5 is a plan view showing another example of a unit pixel group of the image sensor of FIG. 1.
Figure 6:
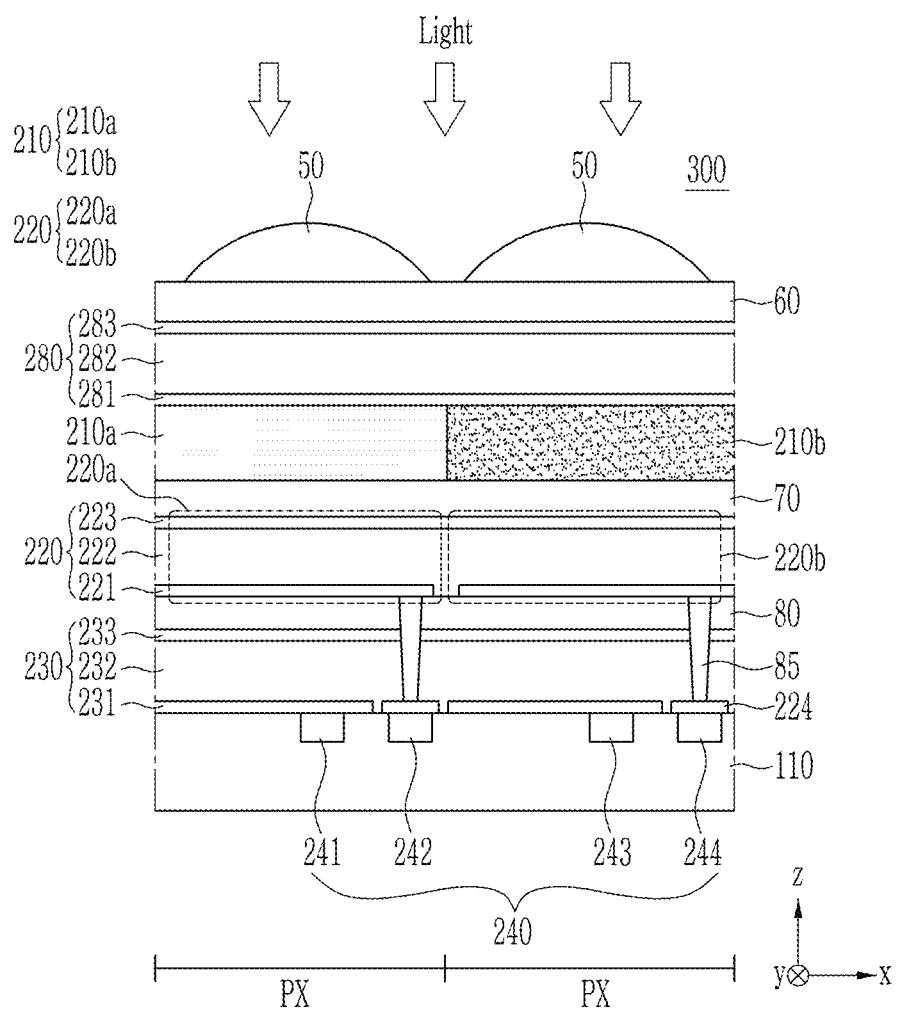
FIG. 6 is a schematic cross-sectional view illustrating an example of two adjacent pixels in the image sensors of FIGS. 1 and 5.

FIG. 5 is a plan view showing another example of a unit pixel group of the image sensor of FIG. 1 and FIG. 6 is a schematic cross-sectional view illustrating an example of two adjacent pixels in the image sensors of FIGS. 1 and 5.

The image sensor 300 according to some example embodiments, like some example embodiments, including the example embodiments shown in FIGS. 1-4, includes the focusing lens 50; the color filter array 210, the first photoelectric conversion device 220, and the second photoelectric conversion device 230.

However, the image sensor 300 according to some example embodiments further includes a third photoelectric conversion device 280 on the color filter array 210, the third photoelectric conversion device 280 may be configured to selectively absorb third light that is light of at least a portion of an infrared wavelength spectrum, for example light of an infrared wavelength spectrum, and convert the absorbed light (e.g., absorbed third light) into electrical signals (e.g., third electrical signals).

The third photoelectric conversion device 280 may be configured to selectively absorb light of at least a portion in the infrared wavelength spectrum, but transmit light of the other wavelength spectra. The third photoelectric conversion device 280 may include an infrared light absorbing layer having such light absorption characteristics, and the infrared light absorbing layer may be at the whole surface, without patterning.

The third photoelectric conversion device 280 includes the fifth electrode 281 and the sixth electrode 283 facing each other, and an infrared photoelectric conversion layer 282 between the fifth electrode 281 and the sixth electrode 283.

One of the fifth electrode 281 or the sixth electrode 283 may be a light-receiving electrode at a light incidence side, and for example, the sixth electrode 283 may be a light-receiving electrode. One of the fifth electrode 281 or the sixth electrode 283 may be an anode and the other may be a cathode. For example, the fifth electrode 281 may be an anode and the sixth electrode 283 may be a cathode. For example, the fifth electrode 281 may be a cathode and the sixth electrode 283 may be an anode. One of the fifth electrode 281 or the sixth electrode 283 may be a pixel electrode, and the other may be a common electrode. For example, the fifth electrode 281 may be a pixel electrode and the sixth electrode 283 may be a common electrode. At least one of the fifth electrode 281 or the sixth electrode 283 may be a light-transmitting electrode. For example, each of the fifth electrode 281 and the sixth electrode 283 may be a light-transmitting electrode.

The infrared photoelectric conversion layer 282 may be configured to absorb light of at least a portion of the infrared wavelength spectrum and convert the absorbed light into an electrical signal. The absorption spectrum of the infrared photoelectric conversion layer 282 may have a maximum absorption wavelength (Amax) in a wavelength region of, for example, greater than about 750 nm and less than 3000 nm. The maximum absorption wavelength (Amax) may belong to a wavelength region of, for example about 750 nm to about 2500 nm, about 750 nm to about 2300 nm, about 750 nm to about 2000 nm, about 750 nm to about 1800 nm, about 750 nm to about 1500 nm, about 750 nm to about 1300 nm, about 750 nm to about 1200 nm, about 750 nm to about 1100 nm, or about 750 nm to about 1000 nm.

The infrared photoelectric conversion layer 282 may include at least one p-type semiconductor and at least one n-type semiconductor which form a pn junction. At least one of the p-type semiconductor or the n-type semiconductor may be an infrared light absorbing material configured to absorb at least a portion of the infrared wavelength spectrum. Each of the p-type semiconductor and the n-type semiconductor may be an organic material, an inorganic material, or an organic-inorganic material. For example, at least one of the p-type semiconductor or the n-type semiconductor may be an organic material.

For example, the p-type semiconductor may be an infrared light absorbing material, such as a quantum dot, a quinoid metal complexes, a cyanine compound, an immonium compound, a diimmonium compound, a triarylmethane compound, a dipyrromethene compound, a diquinone compound, a naphthoquinone compound, an anthraquinone compound, a squarylium compound, a rylene compound, a phthalocyanine compound, a naphthalocyanine compound, a perylene compound, a squaraine compound, a boron-dipyrromethene compound, a nickel-dithiol complex, merocyanine, a diketopyrrolopyrrole, a croconium compound, a derivative thereof, or any combination thereof, but is not limited thereto. For example, the n-type semiconductor may include fullerene or fullerene derivative.

The third photoelectric conversion device 280 may further include an auxiliary layer (not shown) between the fifth electrode 281 and the infrared photoelectric conversion layer 282 and/or between the sixth electrode 283 and the infrared photoelectric conversion layer 282. The auxiliary layer may be, for example, a charge auxiliary layer or an optical auxiliary layer, and the charge auxiliary layer is, for example, a hole transport layer, a hole injection layer, a hole extraction layer, an electron blocking layer, an electron transport layer, an electron injection layer, an electron extraction layer, a hole blocking layer, or any combination thereof, and the optical auxiliary layer may be a light absorption auxiliary layer. The auxiliary layer may include an organic material, an inorganic material, an organic-inorganic material, or any combination thereof.

The fifth electrode 281 of the third photoelectric conversion device 280 is electrically connected to a charge storage (not shown) in the substrate 110 through a charge transfer path (not shown).

The third photoelectric conversion device 280 may, for example, perform a function of improving sensitivity of the image sensor 300 in a low illuminance environment or expanding a dynamic range for detailed division of black and white contrast to increase capability of detecting a 3D image. In addition, the third photoelectric conversion device 280 may perform a biometric recognition function in addition to a function of an image sensor, for example, an iris recognition sensor, a distance recognition sensor, a fingerprint recognition sensor, a blood vessel recognition sensor, or the like, but is not limited thereto. In addition, since the third photoelectric conversion device 280 is at the light incident surface, the image sensor 300 may not include a separate infrared cut-off filter (an IR cut-filter).

Hereinafter, another example of an image sensor according to some example embodiments is described.

Figure 7:
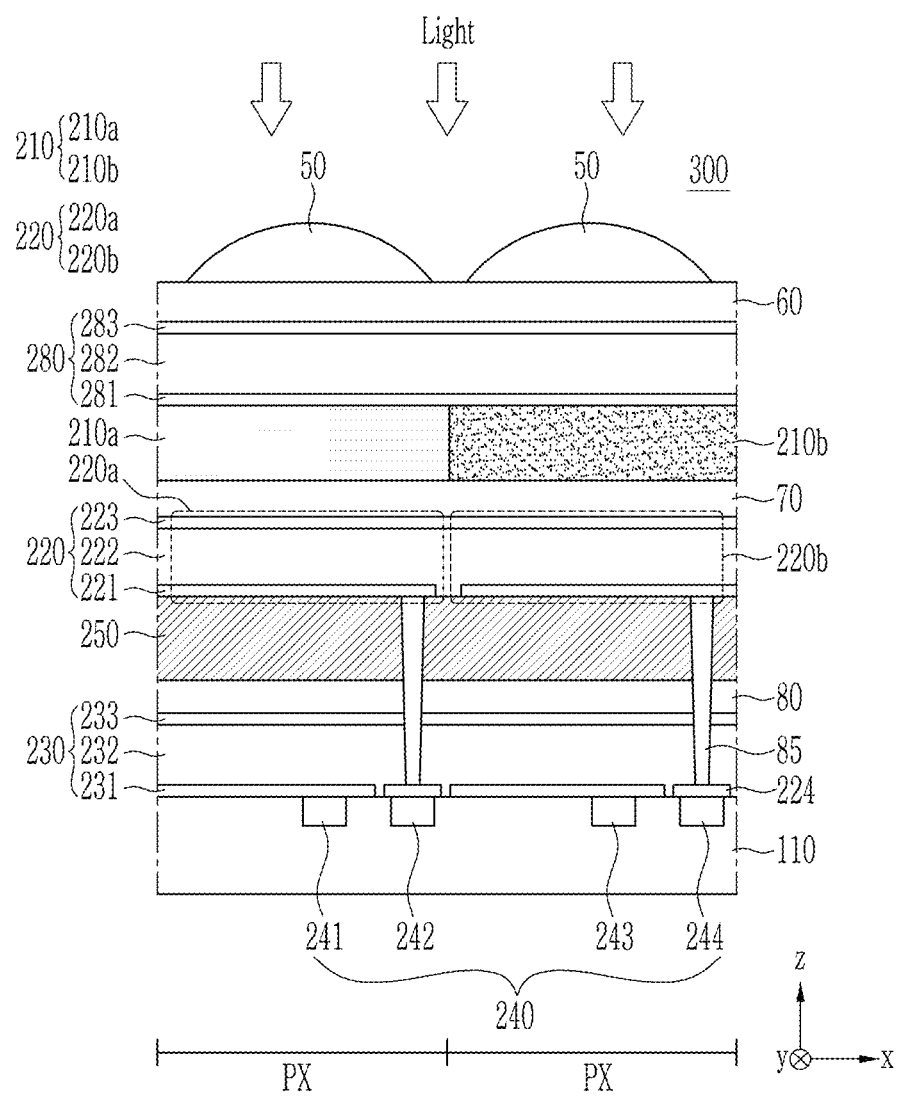
FIG. 7 is a schematic cross-sectional view showing another example of two adjacent pixels in the image sensor of FIGS. 1 and 5.

FIG. 7 is a schematic cross-sectional view showing another example of two adjacent pixels in the image sensor of FIGS. 1 and 5.

Referring FIGS. 1 and 5 along with FIG. 7, the image sensor 300 according to some example embodiments, like some example embodiments including the example embodiments shown in FIG. 6, includes the focusing lens 50 at the light incident surface; the third photoelectric conversion device 280; the color filter array 210 under the third photoelectric conversion device 280; and the first photoelectric conversion device 220 and the second photoelectric conversion device 230 under the color filter array 210.

However, the image sensor 300 according to some example embodiments, unlike some example embodiments including the example embodiments shown in FIG. 6, further includes a third color filter 250 between the first photoelectric conversion device 220 and the second photoelectric conversion device 230. The third color filter 250 may be configured to selectively transmit light of one of the first, second, or third colors in the visible wavelength spectrum, for example, light of a color flowing into the second photoelectric conversion device 230, for example, light of the third color. The third color filter 250 may be, for example, a red filter, a green filter, or a blue filter. The description of the third color filter 250 is the same as described above.

The aforementioned image sensor 300 may be applied to various electronic devices such as an image device, for example, a smart phone, a mobile phone, tablet PC, laptop PC, desktop PC, an electronic book, a navigator, TV, PDA (personal digital assistant), PMP (portable multimedia player), EDA (enterprise digital assistant), a wearable computer, Internet of Things (IoT) devices, Internet of Everything (IoE) devices, a drone, a digital camera, a door lock, a safe, an automatic teller machine (ATM), a security device, or automotive electronic parts but is not limited thereto.

Figure 8:
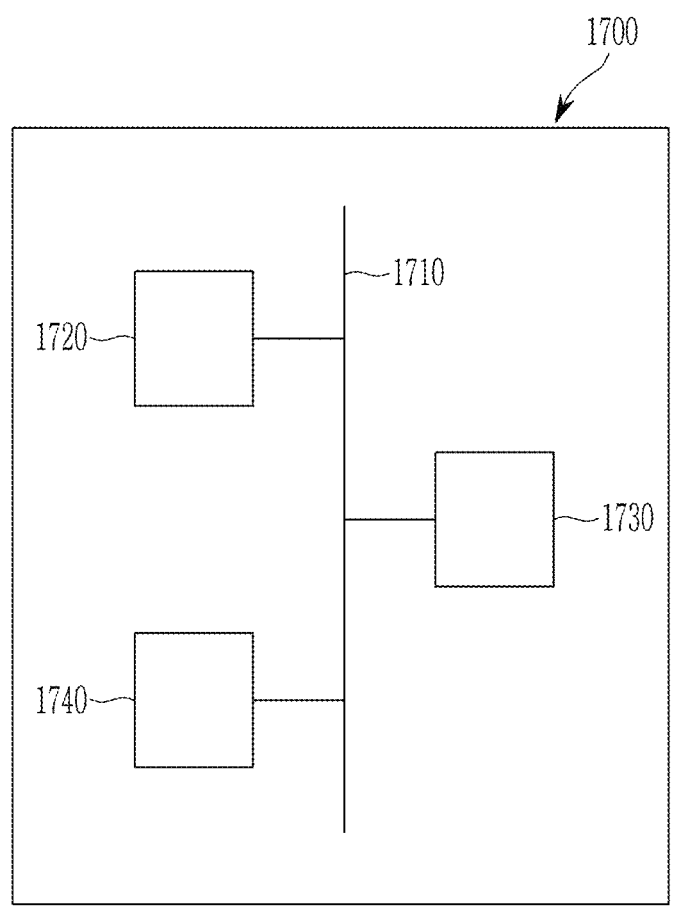
FIG. 8 is a schematic view of an electronic device according to some example embodiments.

FIG. 8 is a schematic view of an electronic device according to some example embodiments.

Referring to FIG. 8, an electronic device 1700 may include a processor 1720, a memory 1730, and an image sensor 1740 that are electrically coupled together via a bus 1710. The image sensor 1740 may be the aforementioned image sensor 300 according to any of the example embodiments. The memory 1730, which may be a non-transitory computer readable medium, may store a program of instructions. The processor 1720 may execute the stored program of instructions to perform one or more functions. For example, the processor 1720 may be configured to process electrical signals generated by the image sensor 1740. The processor 1720 may be configured to generate an output (e.g., an image to be displayed on a display interface) based on such as processing.

One or more of the processor 1720, memory 1730, or image sensor 1740 may be included in, include, and/or implement one or more instances of processing circuitry such as hardware including logic circuits, a hardware/software combination such as a processor executing software; or any combination thereof. In some example embodiments, said one or more instances of processing circuitry may include, but are not limited to, a central processing unit (CPU), an application processor (AP), an arithmetic logic unit (ALU), a graphic processing unit (GPU), a digital signal processor, a microcomputer, a field programmable gate array (FPGA), a System-on-Chip (SoC) a programmable logic unit, a microprocessor, or an application-specific integrated circuit (ASIC), etc. In some example embodiments, any of the memories, memory units, or the like as described herein (e.g., memory 1730) may include a non-transitory computer readable storage device, for example a solid state drive (SSD), storing a program of instructions, and the one or more instances of processing circuitry may be configured to execute the program of instructions to implement the functionality of some or all of any of the electronic device 1700, processor 1720, memory 1730, image sensor 1740, or the like according to any of the example embodiments as described herein.

Hereinafter, some example embodiments are illustrated in more detail with reference to examples. However, the scope of the inventive concepts is not limited to these examples.

Manufacture of First Photoelectric Conversion Device

Example 1

ITO is sputtered on a glass substrate to form a 150 nm-thick lower electrode (anode). Subsequently, a compound represented by Chemical Formula A is thermally deposited on the lower electrode to form a 5 nm-thick lower auxiliary layer, and then, a compound represented by Chemical Formula B (p-type semiconductor, $\lambda_{max}$: 440 nm), a compound represented by Chemical Formula C (p-type semiconductor, $\lambda_{max}$: 630 nm), and fullerene ($C_{60}$, n-type semiconductor) are co-deposited on the lower auxiliary layer in a volume ratio (a thickness ratio) of 1:1:2 to form a 100 nm-thick photoelectric conversion layer. Subsequently, Yb is thermally deposited on the photoelectric conversion layer to form a 1.5 nm-thick upper auxiliary layer, and ITO is sputtered on the upper auxiliary layer to form a 7 nm-thick upper electrode (cathode). Aluminum oxide ($Al_2O_3$) is deposited on the upper electrode (cathode) to be 40 nm thick, and a glass plate is used for sealing to manufacture a photoelectric conversion device.

[Chemical Formula A]

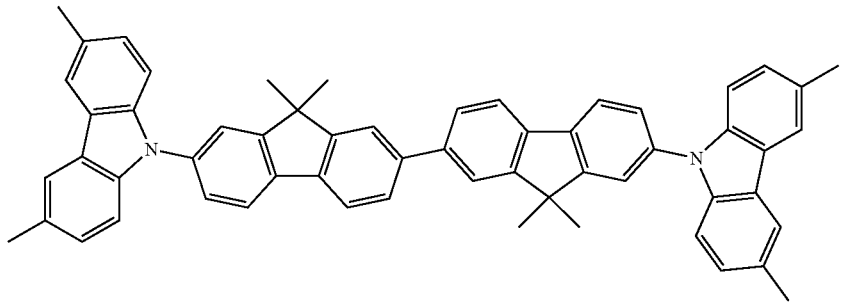

[Chemical Formula B]

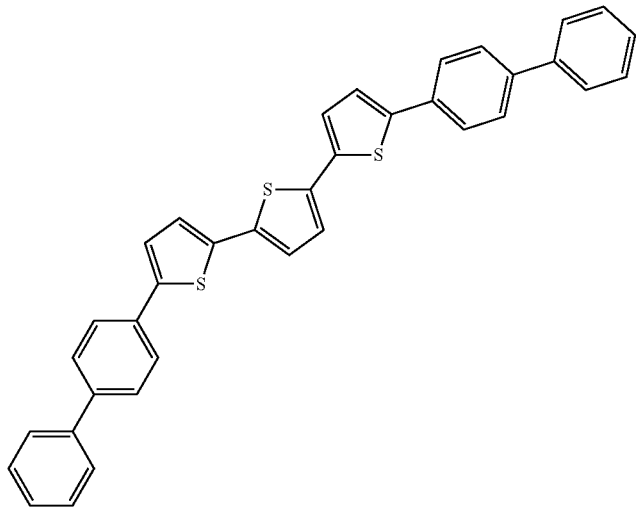

[Chemical Formula C]

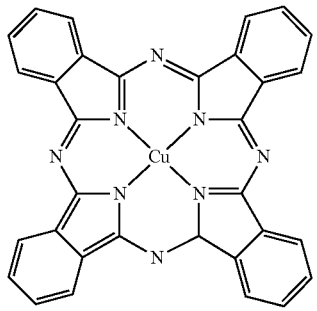

Evaluation I

External quantum efficiency (EQE) depending on a wavelength of the photoelectric conversion device according to Example 1 is evaluated, while applying a voltage of 3 V thereto.

Figure 9:
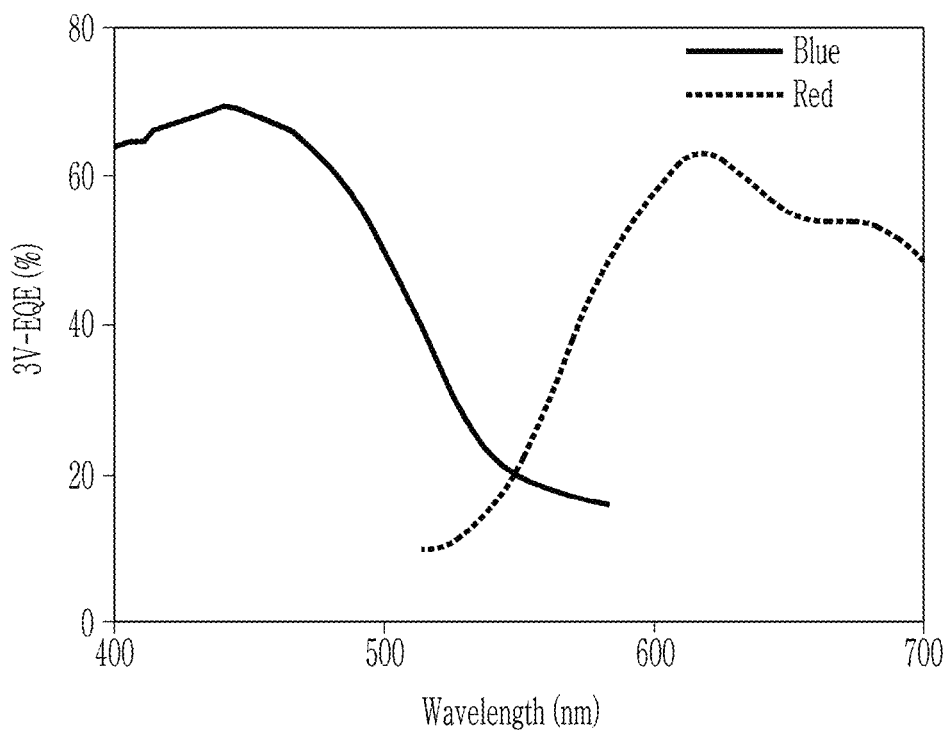
FIG. 9 is a graph showing external quantum efficiency according to wavelength of the photoelectric conversion device according to Example 1.
Figure 10:
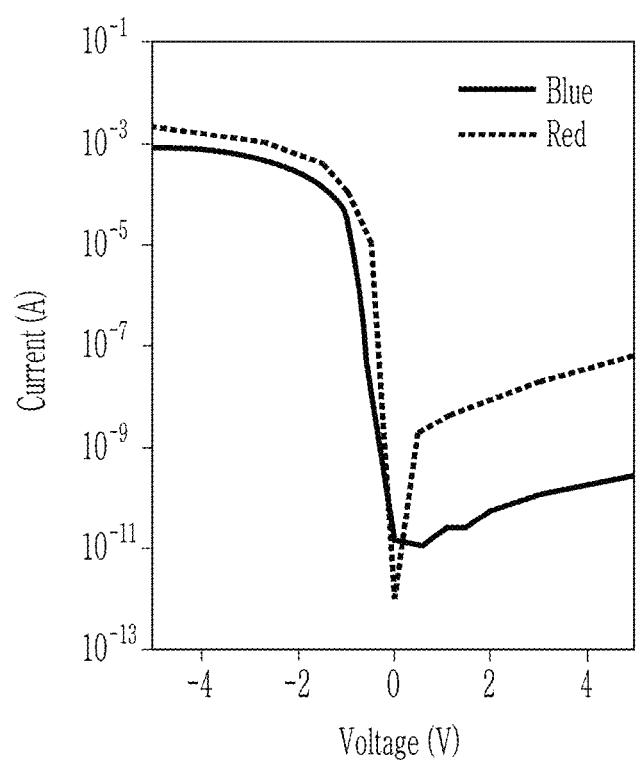
FIG. 10 is a graph showing current characteristics of the photoelectric conversion device according to Example 1.

FIG. 9 is a graph showing external quantum efficiency according to wavelength of the photoelectric conversion device according to Example 1, and FIG. 10 is a graph showing current characteristics of the photoelectric conversion device according to Example 1.

Referring to FIGS. 9 and 10, the photoelectric conversion device according to Example 1 may be configured to selectively absorb blue light and red light, and thus photoelectrically convert them into electrical signals.

Manufacture of Second Photoelectric Conversion Device

Example 2

ITO is sputtered on a glass substrate to form a 150 nm-thick lower electrode (anode). Subsequently, a compound represented by Chemical Formula A is thermally deposited on the lower electrode to form a 5 nm-thick lower auxiliary layer, and then, a compound represented by Chemical Formula D (p-type semiconductor, $\lambda_{max}$: 545 nm) and fullerene (C60, n-type semiconductor) are co-deposited on the lower auxiliary layer in a volume ratio (thickness ratio) of 1:1 to form a 100 nm-thick photoelectric conversion layer. Subsequently, Yb is thermally deposited on the photoelectric conversion layer to form a 1.5 nm-thick upper auxiliary layer, and ITO is sputtered on the upper auxiliary layer to form a 7 nm-thick upper electrode (cathode).

Aluminum oxide (Al$_2$O$_3$) is deposited on the upper electrode (cathode) to be 40 nm thick, and a glass plate is used for sealing to manufacture a photoelectric conversion device.

[Chemical Formula D]

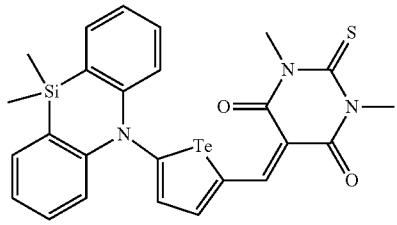

Example 3

A photoelectric conversion device is manufactured according to the same method as Example 2 except that a compound represented by Chemical Formula E (p-type semiconductor, $\lambda_{max}$: 555 nm) and fullerene (C$_{60}$, n-type semiconductor) are co-deposited in a volume ratio (thickness ratio) of 1:1 to form a 100 nm-thick photoelectric conversion layer.

[Chemical Formula E]

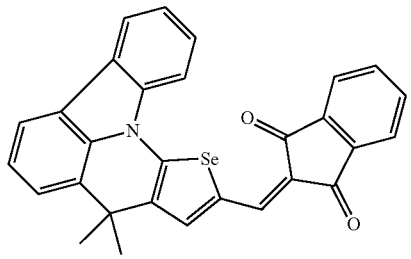

Example 4

A photoelectric conversion device is manufactured according to the same method as Example 2 except that a compound represented by Chemical Formula F (p-type semiconductor, $\lambda_{max}$: 580 nm) and fullerene (C$_{60}$, n-type semiconductor) are co-deposited in a volume ratio (thickness ratio) of 1:2 to 3 to form a 400 nm-thick photoelectric conversion layer.

[Chemical Formula F]

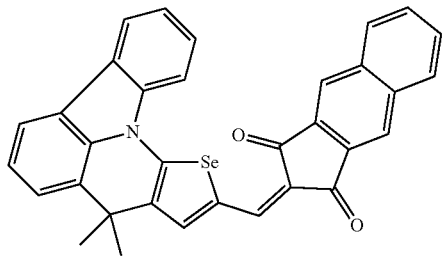

Example 5

A photoelectric conversion device is manufactured according to the same method as Example 2 except that a compound represented by Chemical Formula G (p-type semiconductor, $\lambda_{max}$: 560 nm) and fullerene (C$_{60}$, n-type semiconductor) are co-deposited in a volume ratio (thickness ratio) of 1:2 to 3 to form a 400 nm-thick photoelectric conversion layer.

[Chemical Formula G]

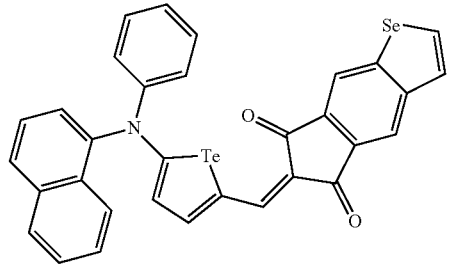

Evaluation II

External quantum efficiency (EQE) depending on a wavelength of the photoelectric conversion devices according to Examples 2 to 5 are evaluated, while applying a voltage of 3 V or 10 V thereto.

Figure 11:
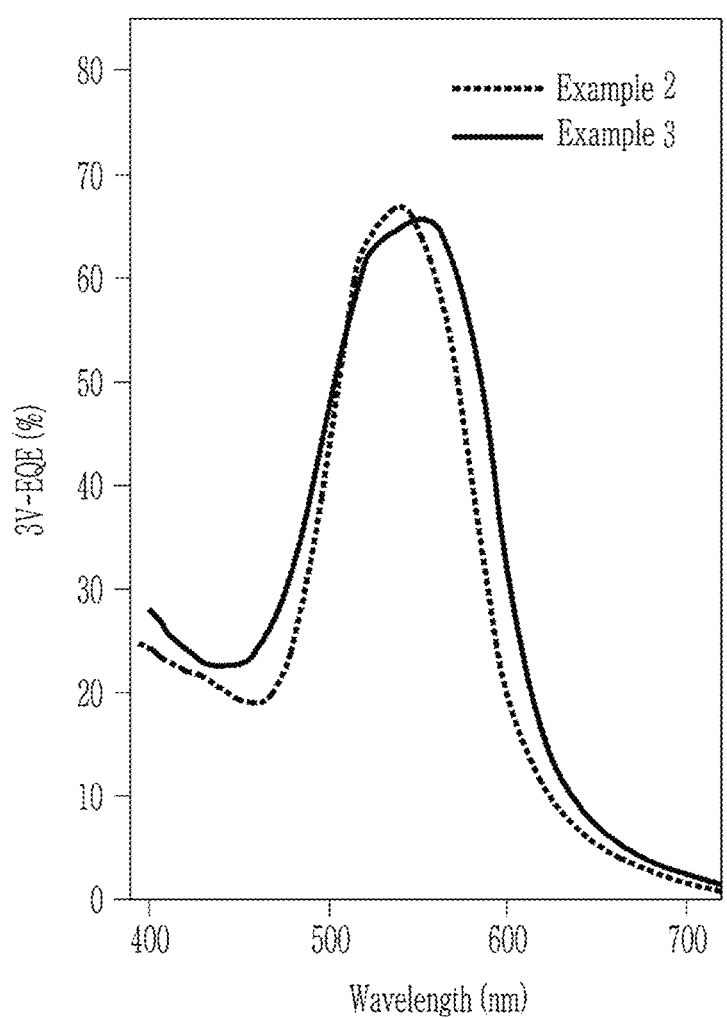
FIG. 11 is a graph showing external quantum efficiency according to wavelength of the photoelectric conversion device according to Examples 2 and 3.
Figure 12:
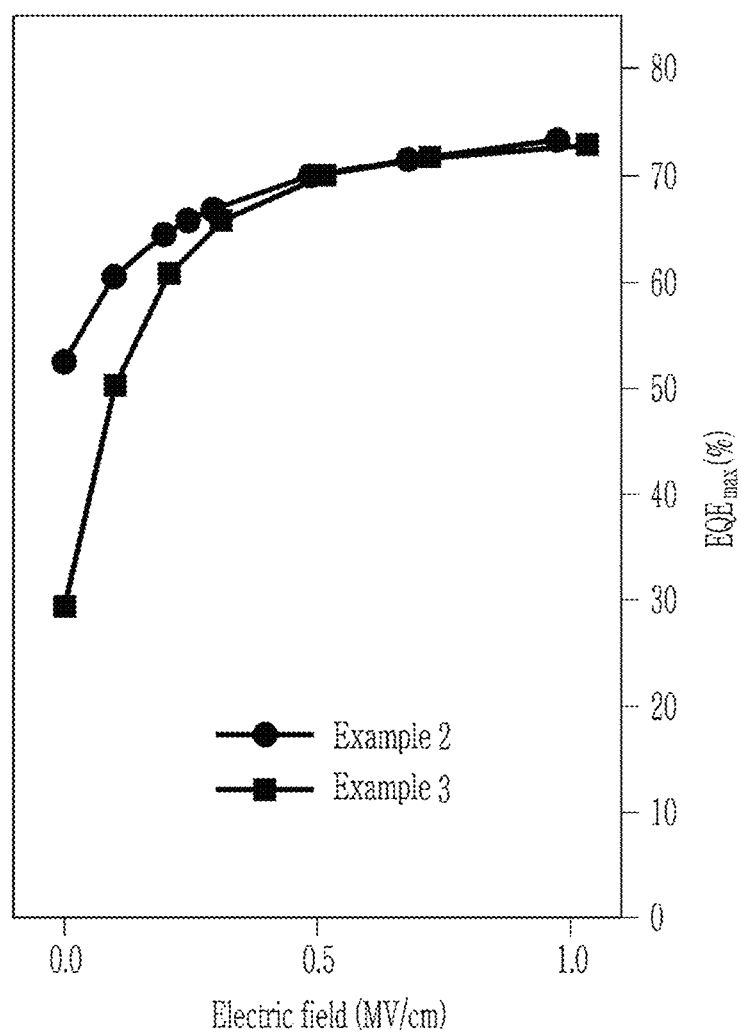
FIG. 12 is a graph showing the maximum external quantum efficiency according to the electric field of the photoelectric conversion devices according to Examples 2 and 3.
Figure 13:
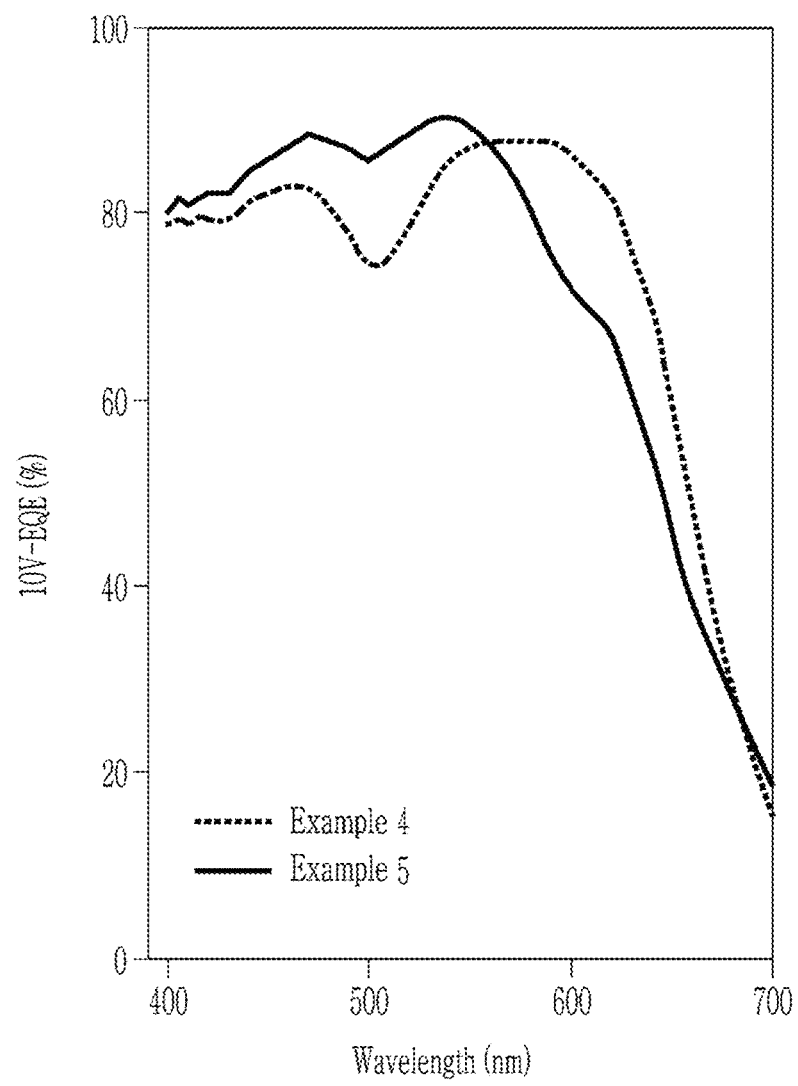
FIG. 13 is a graph showing external quantum efficiency according to wavelength of the photoelectric conversion devices according to Examples 4 and 5.
Figure 14:
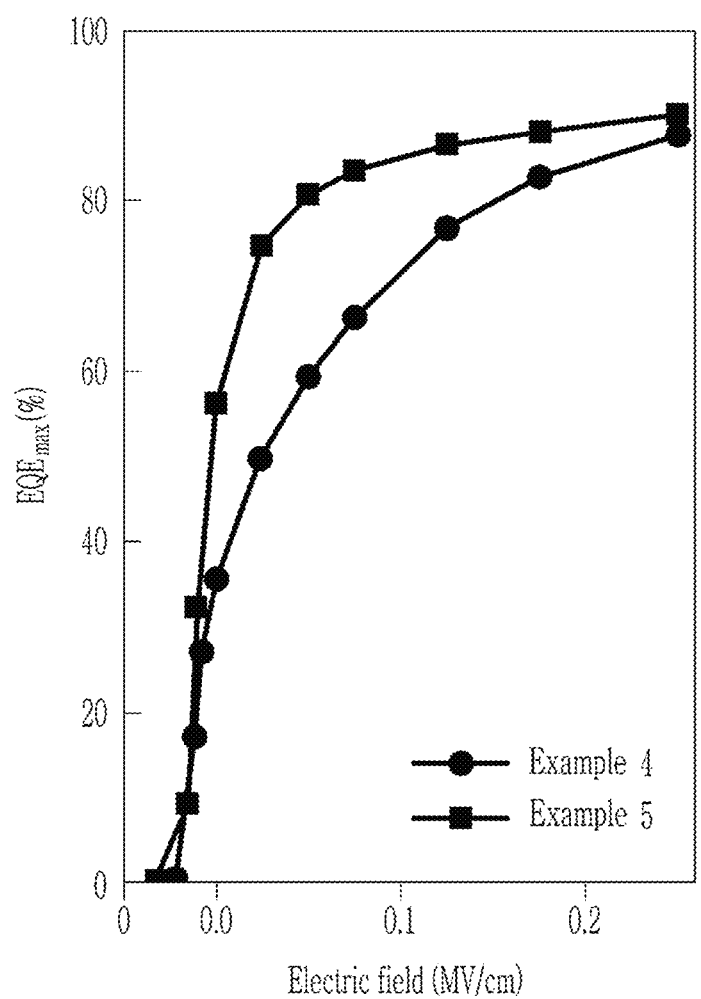
FIG. 14 is a graph showing the maximum external quantum efficiency according to the electric field of the photoelectric conversion devices according to Examples 4 and 5.

FIG. 11 is a graph showing external quantum efficiency according to wavelength of the photoelectric conversion device according to Examples 2 and 3, FIG. 12 is a graph showing the maximum external quantum efficiency according to the electric field of the photoelectric conversion devices according to Examples 2 and 3, FIG. 13 is a graph showing external quantum efficiency according to wavelength of the photoelectric conversion devices according to Examples 4 and 5, and FIG. 14 is a graph showing the maximum external quantum efficiency according to the electric field of the photoelectric conversion devices according to Examples 4 and 5.

Referring to FIGS. 11 and 12, the photoelectric conversion devices according to Examples 2 and 3 selectively absorb green light and photoelectrically convert the absorbed light into electrical signals. In addition, referring to FIGS. 13 and 14, the photoelectric conversion devices according to Examples 4 and 5 absorb light in a wavelength region of about 400 nm to 600 nm and photoelectrically convert the absorbed light into electrical signals.

Design of Image Sensor

Example 6

The photoelectric conversion device according to Example 1 as a first photoelectric conversion device and the photoelectric conversion device according to Example 2 as a second photoelectric conversion device are used to design an image sensor with a structure shown in FIGS. 1 to 3.

Reference Example

An image sensor with the same structure as that of Example 6 is designed except that a silicon photodiode (a thickness: 3 μm) integrated in a semiconductor substrate is included instead of the second photoelectric conversion device according to Example 2.

Evaluation III

Optical cross-talks of the image sensors according to Example 6 and the Reference Example are evaluated.

The optical cross-talks are to evaluate how much the photoelectric conversion devices of different colors in each wavelength region optically interfere by dividing a visible wavelength spectrum into three regions of greater than or equal to about 400 nm and less than 500 nm (blue), about 500 nm to 600 nm (green), and greater than about 600 nm and less than or equal to 700 nm (red).

Figure 15:
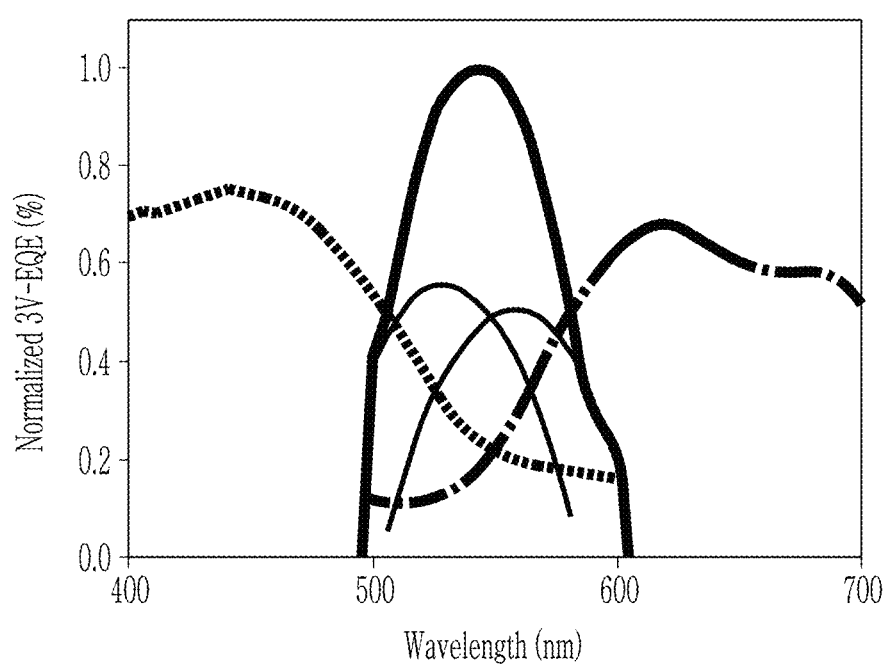
FIG. 15 is a graph showing optical crosstalk of the image sensor according to Example 6.
Figure 16:
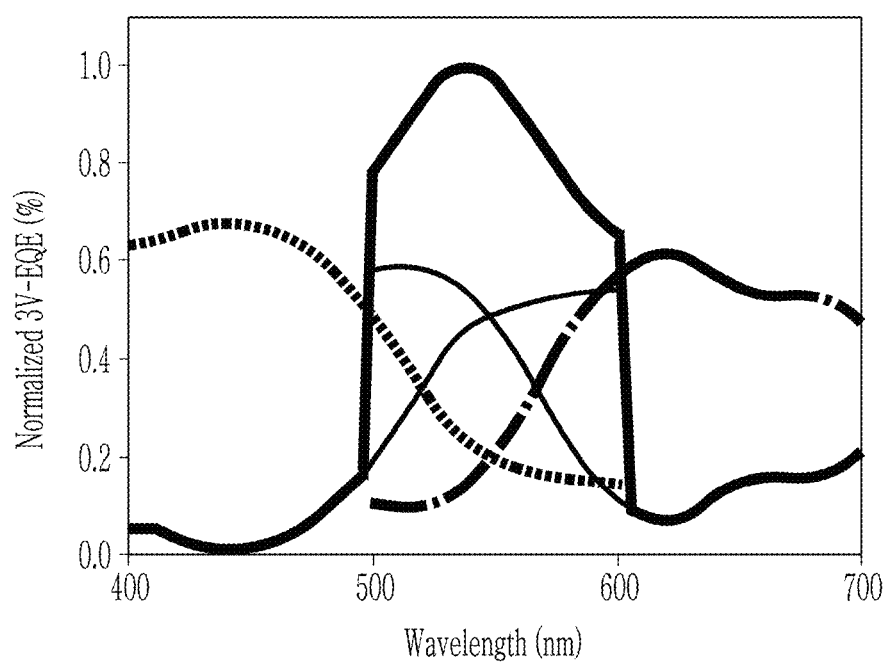
FIG. 16 is a graph showing optical crosstalk of an image sensor according to a reference example.

FIG. 15 is a graph showing optical crosstalk of the image sensor according to Example 6, and FIG. 16 is a graph showing optical crosstalk of an image sensor according to Reference Example.

Referring to FIGS. 15 and 16, the image sensor of Example 6 exhibits a satisfactory Gaussian distribution in the green wavelength spectrum region and also, satisfactory wavelength selectivity and color balance in each blue/green/red wavelength spectrum, compared with the image sensor of the Reference Example.

While the inventive concepts have been described in connection with what is presently considered to be practical example embodiments, it is to be understood that the inventive concepts are not limited to such example embodiments. On the contrary, the inventive concepts are intended to cover various modifications and equivalent arrangements included within the spirit and scope of the appended claims.

What is claimed is:

1. An image sensor, comprising:
   a color filter array;
   a first photoelectric conversion device configured to absorb first light that is a portion of light passing through the color filter array and convert the absorbed first light into first electrical signals; and
   a second photoelectric conversion device configured to absorb second light that is at least a portion of light passing through both the color filter array and the first photoelectric conversion device and convert the absorbed second light into second electrical signals,
   wherein the first photoelectric conversion device includes
      a first electrode and a second electrode facing each other, and
      a first photoelectric conversion layer between the first electrode and the second electrode, the first photoelectric conversion layer configured to selectively absorb a first mixed light of a first color and a second color,
   wherein the second photoelectric conversion device includes
      a third electrode and a fourth electrode facing each other, and
      a second photoelectric conversion layer between the third electrode and the fourth electrode, the second photoelectric conversion layer configured to absorb light including a third color,
   wherein each color of the first color, the second color, and the third color is one of three primary colors,
   wherein the first color, the second color, and the third color are different from each other, and
   wherein the image sensor is configured to combine the first electrical signals converted from the first photoelectric conversion device and the second electrical signals converted from the second photoelectric conversion device to obtain electrical signals of the first color, the second color, and the third color.

2. The image sensor of claim 1, further comprising:
   a substrate supporting the first photoelectric conversion device and the second photoelectric conversion device,
   wherein the substrate does not comprise any silicon-based photodiodes.

3. The image sensor of claim 2, wherein the first photoelectric conversion layer is on an entire surface of the substrate.

4. The image sensor of claim 1, wherein
   the color filter array comprises a first color filter and a second color filter that are each a different one of a cyan filter, a yellow filter, or a magenta filter, and
   the first color filter and the second color filter are configured to selectively transmit second mixed light and third mixed light, respectively, wherein both the second mixed light and the third mixed light include the third color.

5. The image sensor of claim 4, wherein the first color filter and the second color filter are alternately arranged along rows and columns.

6. The image sensor of claim 1, wherein
   the first photoelectric conversion layer comprises a first light absorbing material configured to selectively absorb light of the first color and a second light absorbing material configured to selectively absorb light of the second color, or
   the first photoelectric conversion layer comprises a light absorbing material configured to selectively absorb the first mixed light of the first color and the second color.

7. The image sensor of claim 6, wherein the first light absorbing material configured to selectively absorb light of the first color and the second light absorbing material configured to selectively absorb light of the second color are mixed or stacked in the first photoelectric conversion layer.

8. The image sensor of claim 1, wherein the second photoelectric conversion layer comprises:
   a light absorbing material configured to selectively absorb the light including the third color;
   a light absorbing material configured to selectively absorb a second mixed light of the third color and the first color;
   a light absorbing material configured to selectively absorb a third mixed light of the third color and the second color;
   a light absorbing material configured to selectively absorb a fourth mixed light of the first color, the second color, and the third color; or
   any combination thereof.

9. The image sensor of claim 1, further comprising a third color filter between the first photoelectric conversion device and the second photoelectric conversion device, the third color filter being configured to selectively transmit the light of the third color.

10. The image sensor of claim 1, wherein
    the color filter array comprises a cyan filter and a yellow filter,
    the first color is blue,
    the second color is red, and
    the third color is green.

11. The image sensor of claim 10, further comprising a green filter between the first photoelectric conversion device and the second photoelectric conversion device.

12. The image sensor of claim 1, wherein
the color filter array comprises a magenta filter and a cyan filter,
the first color is red,
the second color is green, and
the third color is blue.

13. The image sensor of claim 12, further comprising a blue filter between the first photoelectric conversion device and the second photoelectric conversion device.

14. The image sensor of claim 1, wherein
the color filter array comprises a yellow filter and a magenta filter,
the first color is green,
the second color is blue, and
the third color is red.

15. The image sensor of claim 14, further comprising a red filter between the first photoelectric conversion device and the second photoelectric conversion device.

16. The image sensor of claim 1, further comprising a third photoelectric conversion device configured to absorb third light that is light of at least a portion of an infrared wavelength spectrum and to convert the absorbed third light into a third electrical signal.

17. An electronic device comprising the image sensor of claim 1.

* * * * *